United States Patent [19]

Farid et al.

[11] Patent Number: 4,743,531

[45] Date of Patent: May 10, 1988

[54] DYE SENSITIZED PHOTOGRAPHIC IMAGING SYSTEM

[75] Inventors: Samir Y. Farid, Rochester; Neil F. Haley, Fairport; Roger E. Moody; Donald P. Specht, both of Rochester, all of N.Y.

[73] Assignee: Eastman Kodak Company, Rochester, N.Y.

[21] Appl. No.: 933,712

[22] Filed: Nov. 21, 1986

[51] Int. Cl.$^4$ ................................................. G03C 1/72
[52] U.S. Cl. .................................... 430/281; 430/286; 430/287; 430/919; 430/920; 522/25
[58] Field of Search .................. 522/25; 430/281, 919, 430/920, 271, 286, 287

[56] References Cited

U.S. PATENT DOCUMENTS

| | | | |
|---|---|---|---|
| Re. 27,922 | 2/1974 | Heseltine et al. | 96/35.1 |
| Re. 27,925 | 2/1974 | Jenkins et al. | 96/35.1 |
| 4,289,842 | 9/1981 | Tan et al. | 430/287 |
| 4,399,209 | 8/1983 | Sanders et al. | 430/138 |
| 4,440,846 | 4/1984 | Sanders et al. | 430/138 |
| 4,497,889 | 2/1985 | Fuerniss | 430/260 |
| 4,590,147 | 5/1986 | Lindley | 430/286 |

FOREIGN PATENT DOCUMENTS 2083832A  9/1981  United Kingdom ................ 430/920

OTHER PUBLICATIONS

Research Disclosure, vol. 200, Dec. 1980, Item 20036.
Specht, Martic, and Farid, "A New Class of Triplet Sensitizers", Tetrahedron, vol. 38, pp. 1203–1211, 1982.

Primary Examiner—Jack P. Brammer
Attorney, Agent, or Firm—Carl O. Thomas

[57] ABSTRACT

A photographic imaging system is disclosed comprised of an imaging dye or a precursor thereof, a hardenable organic component containing ethylenic unsaturation sites and capable of imagewise modulating mobility of the dye or dye precursor as a function of addition at the sites of ethylenic unsaturation, and coinitiators for ethylenic addition. The coinitiators include an azinium salt activator and a photosensitizer which is a dye exhibiting a reduction potential which in relation to that of said ionized azinium salt activator is at most 0.1 volt more positive, with the further proviso that, when the photosensitizer is a keto dye having its principal absorption peak at a wavelength shorter than 550 nm, it exhibits when excited by imaging radiation an intersystem crossing efficiency to a triplet state of less than 10 percent.

24 Claims, No Drawings

DYE SENSITIZED PHOTOGRAPHIC IMAGING SYSTEM

FIELD OF THE INVENTION

This invention relates to photography. More specifically, this invention relates to an imaging system which modulates the mobility of a dye image forming material as a function of exposure.

BACKGROUND OF THE INVENTION

A variety of photographic imaging systems are known for producing dye images wherein the mobility of the dye or its precursor is controlled in an imagewise manner by addition to ethylenic (vinyl) unsaturation sites in an associated hardenable organic component. The hardenable component undergoes photoinduced addition reactions, typically polymerization and/or crosslinking, at the ethylenic unsaturation sites which hardens the organic component and thereby imparts its ability to modulate mobility of the associated dye or dye precursor.

A simple illustration of such an imaging system is a negative working photoresist which contains an imaging dye. Imagewise exposure of the photoresist followed by development leaves a dye image in exposed areas. While there are a plethora of known negative working photoresists which might be cited, Tan et al U.S. Pat. No. 4,289,842 illustrates photoresists employing crosslinkable copolymers containing ethylenic unsaturation in pendant groups, Lindley U.S. Pat. No. 4,590,147 illustrates photoresists including vinyl oligomers, and Fuerniss U.S. Pat. No. 4,497,889 illustrates photoresists containing vinyl monomers.

Illustrative of more elaborate imaging systems capable of producing transferred dye images are Sanders et al U.S. Pat. Nos. 4,399,209 and 4,440,846. A dye precursor and a hardenable organic component containing ethylenic unsaturation sites are coated together on a support in rupturable microcapsules. Imagewise exposure to actinic radiation hardens the organic component by inducing addition at its ethylenic unsaturation sites. Upon subsequent rupture of the microcapsules only the dye precursor in unexposed microcapsules have the mobility to transfer to a receiving sheet where a viewable dye image is formed.

Since the hardenable organic components containing ethylenic unsaturation exhibit only limited direct response to exposing radiation, it is common practice to include an initiator of the ethylenic addition reaction. In practice negative working photoresists are typically imagewise exposed using radiation wavelengths in the near ultraviolet region of the spectrum. While Sanders et al recognize that imaging exposures are possible with various forms and wavelengths of radiation, the preferred wavelengths of exposure are limited to the ultraviolet and the blue, up to about 480 nm, with the initiators for the ethylenic addition reaction disclosed being those which are responsive at these wavelengths of exposure.

In order to achieve higher levels of sensitivity (i.e., higher imaging speeds) than can be achieved with a single initiator, it is common practice in preparing imaging compositions to employ coinitiators. One of the coinitiators is a photosensitizer. Photosensitizers are relied upon to capture photons of exposing radiation. The remaining coinitiator is referred to as an activator. The activator is not relied upon to respond directly to exposing radiation, but rather adjacent activator and photosensitizer molecules react, following excitation of the latter by photon capture, causing release of a free radical which in turn induces immobilizing addition reactions at sites of ethylenic unsaturation.

Imaging systems which rely on a combination of an activator and a photosensitizer are typically exposed in the ultraviolet or blue portion of the spectrum. The necessity of using shorter imaging wavelengths places constraints on the master or pattern employed for imaging. For example, a master which presents a longer wavelength visible dye image, but exhibits little variance in ultraviolet or blue transmittance is not well suited for imagewise exposing an imaging system which responds only to ultraviolet or blue radiation. Further, such imaging systems are disadvantageous and have not found acceptance in producing multicolor images.

There are several difficulties in attempting to formulate imaging systems which respond to wavelengths longer than 550 nm. For example, the energy contained in light photons declines as the wavelength of the radiation increases. This places increased demands on any photosensitizer coinitiator intended to absorb in longer wavelength regions of the spectrum. Additionally, generally more elaborate molecules are required to absorb longer wavelength radiation. This increases the bulk of the photosensitizer. Related to this, reduced thermal and storage stability have been a point of concern.

It is generally accepted that photosensitizer coinitiators function by photon absorption to lift an electron from an occupied molecular orbital to a higher energy, unoccupied orbital. The spin of the electron lifted to the higher energy orbital corresponds to that which it exhibited in its original orbital or ground state. Thus, the photosensitizer in its initially formed excited state is in a singlet excited state. The duration of the singlet excited state is limited, typically less than a few nanoseconds. The excited photosensitizer can return from its singlet excited state directly to its original ground state, dissipating the captured photon energy. Alternatively, the singlet excited state photosensitizer in some instances undergoes intersystem crossing through spin inversion to another excited state, referred to as a triplet state, wherein lifetimes are typically in the microsecond to millisecond range. Since photosensitizer coinitiators which exhibit triplet states remain in an excited state for time periods that are orders of magnitude greater than photosensitizer coinitiators which exhibit only singlet excited states, a much longer time period is available for reaction with the paired activator coinitiator.

Specht and Farid U.K. No. 2,083,832A discloses photopolymerization coinitiators including azinium activators and amino-substituted photosensitizer (e.g., amino-substituted ketocoumarin) coinitiators which exhibit triplet states on excitation. An essentially cumulative disclosure is provided by *Research Disclosure*, Vol. 200, December 1980, Item 20036. *Research Disclosure* is published by Kenneth Mason Publications, Ltd., Emsworth, Hampshire P010 7DD, England. As illustrated by Specht, Martic, and Farid, "A New Class of Triplet Sensitizers", *Tetrahedron*, Vol. 38, pp. 1203–1211, 1982, these amino-substituted 3-ketocoumarins exhibit intersystem crossing efficiencies ranging well above 10 percent—e.g., from 0.18 to 0.92 or 18 to 92 percent, measured in polymer.

Heseltine et al and Jenkins et al U.S. Pat. Nos. Re. 27,922 and Re. 27,925 disclose N-oxyazinium initiators for photocrosslinking and photopolymerizaation, respectively, which are capable of responding directly to visible light. The difficulty of having the free radical generating azinium initiator capable of directly absorbing light is that synthesis is relatively complex. Further, synthesis and handling of the initiator must be performed in the absence of light, which is a significant disadvantage.

In concurrently filed, commonly assigned patent applications, Ser. Nos. 933,658 and 933,660, titled NEGATIVE WORKING PHOTORESISTS RESPONSIVE TO SHORTER WAVELENGTHS AND NOVEL COATED ARTICLES and NEGATIVE WORKING PHOTORESISTS RESPONSIVE TO LONGER WAVELENGTHS AND NOVEL COATED ARTICLES, respectively, negative working photoresists are disclosed comprised of a film forming component containing ethylenic unsaturation and capable of selective immobilization as a function of ethylenic addition, and activator and photosensitizer coinitiators for ethylenic addition. The activator is an azinium salt, and the photosensitizer is a dye having a reduction potential which in relation to that of the azinium salt activator is at most 0.1 volt more positive.

In concurrently filed, commonly assigned patent application, Ser. No. 933,657, titled ENHANCED IMAGING COMPOSITION CONTAINING AN AZINIUM ACTIVATOR, an imaging composition is disclosed comprised of an organic component containing ethylenic unsaturation sites and capable of selective hardening by addition at the sites of ethylenic unsaturation, an azinium salt activator, a photosensitizer having a reduction potential which in relation to the reduction potential of the azinium salt activator is at most 0.1 volt more positive, and an image enhancing amount of benzene substituted with an electron donating amino group and one or more groups capable of imparting a net Hammett sigma value electron withdrawing characteristic of at least +0.20 volt to said benzene ring.

SUMMARY OF THE INVENTION

In one aspect this invention is directed to a photographic imaging system comprised of an imaging dye or a precursor thereof, a hardenable organic component containing ethylenic unsaturation sites and capable of imagewise modulating mobility of the dye or dye precursor as a function of addition at the sites of ethylenic unsaturation and coinitiators for ethylenic addition comprised of an azinium salt activator and a photosensitizer which is a dye exhibiting a reduction potential which in relation to that of the azinium salt activator is at most 0.1 volt more positive, with the further proviso that, when said photosensitizer is a keto dye having its principal absorption peak at a wavelength shorter than 550 nm, it exhibits when excited by imaging radiation an intersystem crossing efficiency to a triplet state of less than 10 percent.

In a preferred form this invention is directed to a photographic imaging system comprised of a precursor of an additive or subtractive primary imaging dye, a hardenable organic component containing ethylenic unsaturation sites and capable of imagewise modulating mobility of the dye precursor as a function of addition at the sites of ethylenic unsaturation and coinitiators for ethylenic addition comprised of an azinium salt activator and a photosensitizer which is a subtractive primary dye of a hue corresponding to or a complement of the primary imaging dye and exhibiting a reduction potential which in relation to that of the azinium salt activator is at most 0.1 volt more positive, with the further proviso that, when said photosensitizer is a keto dye having its principal absorption peak at a wavelength shorter than 550 nm, it exhibits when excited by imaging radiation an intersystem crossing efficiency to a triplet state of less than 10 percent.

The present invention provides highly desirable photographic imaging systems which produce primary dye images by relying upon hardening caused by free radical release from an azinium activator. By employing dyes as photosensitizers these imaging systems can respond efficiently to imaging radiation of any desired wavelength in the visible radiation and can exhibit imaging sensitivity extending into the near infrared portion of the spectrum. The imaging systems nevertheless exhibit thermal and storage stabilities which compare well with those of imaging systems which are responsive to ultraviolet wavelength imaging exposures.

The present invention provides such imaging systems in which the wavelength of stimulating radiation can be correlated with the hue of the dye image over the entire visible spectrum. In other words, the present invention permits imaging systems to be provided which produce yellow, magenta, or cyan subtractive primary dye images in response to blue, green, or red light exposures, respectively. Alternatively, image dyes can be of an additive primary hue. That is, the present invention permits imaging systems to be provided which produce blue, green, or red additive primary dye images in response to blue, green, or red light exposures, respectively.

In this respect the imaging systems of this invention differ from the false sensitized imaging systems of the prior art which have been capable of producing dye images of any desired hue, but have relied upon shorter wavelength, typically ultraviolet or blue, imagewise exposures to stimulate a hardening addition reaction. The present invention avoids the disadvantages inherent in false sensitization, such as those noted above. Further, the imaging system of this invention lends itself to multicolor imaging. The imaging systems of this invention, though capable of responding to light in any desired region of the visible spectrum nevertheless exhibit high levels of sensitivity. Still other advantages of the invention can be appreciated from the description of preferred embodiments and examples which follow.

DESCRIPTION OF PREFERRED EMBODIMENTS

It has been discovered that photographic imaging systems which rely an azinium activator to initiate hardening of an organic component containing ethylenic unsaturation and thereby modulate mobility of an imaging dye or its precursor as a function of hardening can be improved in their performance capabilities by the incorporation of certain dyes capable of acting as photosensitizers. Specifically, it is the recognition of this invention that photosensitizers useful with azinium salt activators are capable of imparting imaging response at any desired wavelength within the visible spectrum. More specifically, it has been discovered that the photosensitizers for the azinium salt activators can be selected from any known dye class, provided the dye selected exhibits a reduction potential which in relation to that of the azinium activator is at most 0.1 volt more positive.

Whereas it was previously recognized by Specht and Farid U.K. No. 2,083,832A that amino-substituted photosensitizers, including certain keto dyes, specifically keto coumarin dyes and keto methylene dyes (merocyanine dyes), having a principal absorption peak at a wavelength up to 550 nm and exhibiting relatively high intersystem crossing efficiencies are useful as coinitiators in combination with azinium activators, it has now been recognized that dyes having a principal absorption peak at a wavelength longer than 550 nm (hereinafter referred to as longer wavelength dyes) and satisfying the required reduction potentials are highly efficient photosensitizers when used as coinitiators with azinium salt activators. Additionally, it has been recognized that both longer wavelength dyes and shorter wavelength dyes (those exhibiting a principal absorption peak at a wavelength shorter than 550 nm) satisfying the required reduction potentials are highly efficient photosensitizers even when they exhibit relatively low intersystem crossing efficiencies—i.e., intersystem crossing efficiencies of less than 10 percent.

It is therefore apparent that the dyes useful as photosensitizers can exhibit any desired hue appropriate for the imaging application. It is generally preferred to employ a subtractive primary dye as a photosensitizer, particularly, when producing multicolor images. A subtractive primary dye has a principal absorption peak in one of the blue (400 to 500 nm), green (500 to 600 nm), or red (600 to 700 nm) regions of the spectrum and appears yellow, magenta, or cyan.

Among specifically contemplated dye classes from which dyes can be selected are coumarin (including ketocoumarin and sulfonocoumarin) dyes, merocyanine dyes, merostyryl dyes, oxonal dyes, and hemioxonal dyes. Dyes from each of the foregoing classes all contain a keto group in the blue absorbing chromophore and are all therefore designated keto dyes. In addition, it is a specific recognition of this invention that a dye photosensitizer useful in the practice of this invention need not be a keto dye. That is, a keto group in the chromophore of the dye is not essential. Non-keto dyes embrace a variety of dye classes, including non-keto polymethine dyes, anthracene dyes, rhodamine dyes, acridine dyes, aniline dyes, and azo dyes. Non-keto polymethine dyes include cyanine, hemicyanine, and styryl dyes.

In one preferred form of the invention the dye photosensitizers are chosen from the polymethine dye classes, which includes the cyanines, merocyanines, complex cyanines and merocyanines (i.e., tri-, tetra- and polynuclear cyanines and merocyanines), oxonols, hemioxonols, styryls, merostyryls, and streptocyanines.

The cyanine dyes include, joined by a methine linkage, two basic heterocyclic nuclei, such as azolium or azinium nuclei, for example, those derived from pyridinium, quinolinium, isoquinolinium, oxazolium, thiazolium, selenazolium, indazolium, pyrazolium, pyrrolium, indolium, 3H-indolium, imidazolium, oxadiazolium, thiadioxazolium, benzoxazolium, benzothiazolium, benzoselenazolium, benzotellurazolium, benzimidazolium, 3H- or 1H-benzoindolium, naphthoxazolium, naphthothiazolium, naphthoselenazolium, naphthotellurazolium, carbazolium, pyrrolopyridinium, phenanthrothiazolium, and acenaphthothiazolium quaternary salts.

Exemplary of the basic heterocyclic nuclei are those satisfying Formulas 1 and 2.

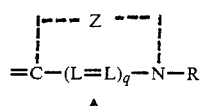 Formula 1

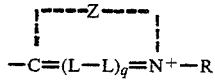

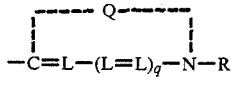 Formula 2

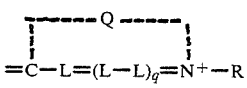

where

Z represents the elements needed to complete a cyclic nucleus derived from basic heterocyclic nitrogen compounds such as oxazoline, oxazole, benzoxazole, the naphthoxazoles (e.g., naphth[2,1-d]oxazole, naphth[2,3-d]oxazole, and naphth[1,2-d]oxazole), oxadiazole, thiazoline, thiazole, benzothiazole, the naphthothiazoles (e.g., naphtho[2,1-d]thiazole), the thiazoloquinolines (e.g., thiazolo[4,5-d]quinoline), phenanthrothiazole, acenaphthothiazole, thiadioxazole, selenazoline, selenazole, benzoselenazole, the naphthoselenazoles (e.g., naphtho[1,2-d]selenazole), benzotellurazole, naphthotellurazoles (e.g., naphtho[1,2-d]tellurazole), imidazoline, imidazole, benzimidazole, the naphthimidazoles (e.g., naphth[2,3-d]imidazole), 2- or 4-pyridine, 2- or 4-quinoline, 1- or 3-isoquinoline, benzoquinoline, 3H-indole, 1H- or 3H-benzoindole, and pyrazole, which nuclei may be substituted on the ring by one or more of a wide variety of substituents such as hydroxy, the halogens (e.g., fluoro, chloro, bromo, and iodo), alkyl groups or substituted alkyl groups (e.g., methyl, ethyl, propyl, isopropyl, butyl, octyl, dodecyl, octadecyl, 2-hydroxyethyl, 3-sulfopropyl, carboxymethyl, 2-cyanoethyl, and trifluoromethyl), aryl groups or substituted aryl groups (e.g., phenyl, 1-naphthyl, 2-naphthyl, 4-sulfophenyl, 3-carboxyphenyl, and 4-biphenylyl), aralkyl groups (e.g., benzyl and phenethyl), alkoxy groups (e.g., methoxy, ethoxy, and isopropoxy), aryloxy groups (e.g., phenoxy and 1-naphthoxy), alkylthio groups (e.g., methylthio and ethylthio), arylthio groups (e.g., phenylthio, p-tolylthio, and 2-naphthylthio), methylenedioxy, cyano, 2-thienyl, styryl, amino or substituted amino groups (e.g., anilino, dimethylamino, diethylamino, and morpholino), acyl groups, (e.g., formyl, acetyl, benzoyl, and benzenesulfonyl);

Q represents the elements needed to complete a cyclic nucleus derived from basic heterocyclic nitrogen compounds such as pyrrole, indole, carbazole, benzindole, pyrazole, indazole, and pyrrolopyridine;

R represents alkyl groups, aryl groups, alkenyl groups, or aralkyl groups, with or without substituents, (e.g., carboxy, hydroxy, sulfo, alkoxy, sulfato, thiosulfato, phosphono, chloro, and bromo substituents);

L is in each occurrence independently selected to represent a substituted or unsubstituted methine group—e.g., —CR$^1$=groups, where R$^1$ represents hydrogen when the methine group is unsubstituted and most commonly represents alkyl of from 1 to 4 carbon atoms or phenyl when the methine group is substituted; and q is 0 or 1.

Cyanine dyes can contain two heterocyclic nuclei of the type shown in Formula 1 joined by a methine linkage containing an uneven number of methine groups or can contain a heterocyclic nucleus according to each of Formulae 1 and 2 joined by a methine linkage containing an even number of methine groups, where the methine groups can take the form —CR$^1$= as described above. The greater the number of the methine groups linking nuclei in the polymethine dyes in general and the cyanine dyes in particular the longer the absorption wavelengths of the dyes. For example, dicarbocyanine dyes (cyanine dyes containing five methine groups linking two basic heterocyclic nuclei) exhibit longer absorption wavelengths than carbocyanine dyes (cyanine dyes containing three methine groups linking two basic heterocyclic nuclei) which in turn exhibit longer absorption wavelengths than simple cyanine dyes (cyanine dyes containing a single methine group linking two basic heterocyclic nuclei). Carbocyanine and dicarbocyanine dyes are longer wavelength dyes while simple cyanine dyes are typically yellow dyes, but can exhibit absorption maxima up to about 550 nm in wavelength with proper choice of nuclei and other components capable of bathochromically shifting absorption.

One of the techniques for bathochromically shifting the absorption maxima of polymethine dyes in general and cyanine dyes in particular is to include in the methine linkage an oxocarbon bridging nucleus. Exemplary oxocarbon bridging nuclei can take any of the forms indicated by Formula 3.

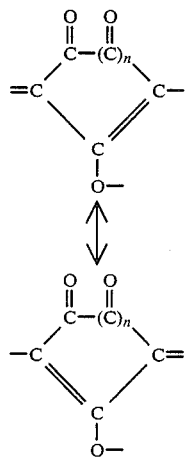

Formula 3 wherein n is the integer 0, 1, or 2.

Merocyanine dyes link one of the cyanine dye type basic heterocyclic nuclei described above to an acidic keto methylene nucleus through a methine linkage as described above, but containing zero, two, or a higher even number of methine groups. Zero methine dyes, those containing no methine groups in the linkage between nuclei, exhibit a double bond linkage between the nuclei in one resonance form and a single bound linkage in another resonance form. In either resonance from the linkage sites in the nuclei are formed by methine groups forming a part of each nucleus. Zero methine polymethine dyes are yellow dyes.

Exemplary acidic nuclei are those which satisfy Formula 4.

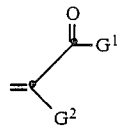

Formula 4 where

G$^1$ represents an alkyl group or substituted alkyl group, an aryl or substituted aryl group, an aralkyl group, an alkoxy group, an aryloxy group, a hydroxy group, an amino group, or a substituted amino group, wherein exemplary substituents can take the various forms noted in connection with Formulae 1 and 2;

G$^2$ represent any one of the groups listed for G$^1$ and in addition can represent a cyano group, an alkyl, or arylsulfonyl group, or a group represented by

or G$^2$ taken together with G$^1$ can represent the elements needed to complete a cyclic acidic nucleus such as those derived from 2,4-oxazolidinone (e.g., 3-ethyl-2,4-oxazolidindione), 2,4-thiazolidindione (e.g., 3-methyl-2,4-thiazolidindione), 2-thio-2,4-oxazolidindione (e.g., 3-phenyl-2-thio-2,4-oxazolidindione), rhodanine, such as 3-ethylrhodanine, 3-phenylrhodanine, 3-(3-dimethylaminopropyl)rhodanine, and 3-carboxymethylrhodanine, hydantoin (e.g., 1,3-diethylhydantoin and 3-ethyl-1-phenylhydantoin), 2-thiohydantoin (e.g., 1-ethyl-3-phenyl-2-thiohydantoin, 3-heptyl-1-phenyl-2-thiohydantoin, and arylsulfonyl-2-thiohydantoin), 2-pyrazolin-5-one, such as 3-methyl-1-phenyl-2-pyrazolin-5-one, 3-methyl-1-(4-carboxybutyl)-2-pyrazolin-5-one, and 3-methyl-2-(4-sulfophenyl)-2-pyrazolin-5-one, 2-isoxazolin-5-one (e.g., 3-phenyl-2-isoxazolin-5-one), 3,5-pyrazolidindione (e.g., 1,2-diethyl-3,5-pyrazolidindione and 1,2-diphenyl-3,5-pyrazolidindione), 1,3-indandione, 1,3-dioxane-4,6-dione, 1,3-cyclohexanedione, barbituric acid (e.g., 1-ethylbarbituric acid and 1,3-diethylbarbituric acid), and 2-thiobarbituric acid (e.g., 1,3-diethyl-2-thiobarbituric acid and 1,3-bis(2-methoxyethyl)-2-thiobarbituric acid).

Useful hemicyanine dyes are essentially similar to the merocyanine dyes described above, differing only in substituting for the keto methylene group of Formula 4 the group shown below in Formula 5.

Formula 5 where

G$^3$ and G$^4$ may be the same or different and may represent alkyl, substituted alkyl, aryl, substituted aryl, or aralkyl, as illustrated for ring substituents in Formula 1 or G$^3$ and G$^4$ taken together complete a ring system derived from a cyclic secondary amine, such as pyrrolidine, 3-pyrroline, piperidine, piperazine (e.g., 4-methylpiperazine and 4-phenylpiperazine), morpholine, 1,2,3,4-tetrahydroquinoline, decahydroquinoline, 3-azabicyclo[3,2,2]nonane, indoline, azetidine, and hexahydroazepine.

Useful hemioxonol dyes exhibit a keto methylene nucleus as shown in Formula 4 and a nucleus as shown in Formula 5 joined by a methine linkage as previously described containing one or a higher uneven number of methine groups.

Useful merostyryl dyes exhibit a keto methylene nucleus as shown in Formula 4 and a nucleus as shown in Formula 6 joined by a methine linkage as described above containing one or a higher uneven number of methine groups.

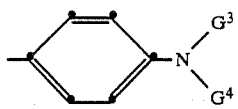

Formula 6 where

G³ and G⁴ are as previously defined.

The cyanine, merocyanine, hemicyanine, hemioxonol, and merostyryl dyes described above are intended to be illustrative of the simpler structural forms of useful polymethine dyes. It is generally recognized that substituents can join the nuclei and methine linkages to form additional cyclic structures. Further, the dyes can contain three or more nuclei. For example, by substituting a merocyanine dye in its methine linkage with a second basic heterocyclic nucleus of the cyanine dye type an allopolar cyanine dye can be formed. Further, the various substituents not forming a part of the dye chromophore can be varied as desired to tailor dye physical properties, particularly hydrophobicity and hydrophillicity, to suit the particular film forming components employed. By choosing as the aliphatic moieties of the dyes hydrocarbon groups having more carbon atoms (e.g., from about 6 to 20 carbon atoms) the dyes can be rendered more oleophilic while hydrocarbon groups containing fewer numbers of carbon atoms (e.g., 1 to 5 carbon atoms) and particularly those bearing polar substituents render the dyes more hydrophilic. The aromatic moieties of the dyes typically contain from 6 to 10 carbon atoms.

In addition to being a dye as previously defined, to be useful as a photosensitizer in the present invention the dye must exhibit a reduction potential which is at most 0.1 volt more positive than the reduction potential of the azinium salt activator with which it is employed. Electron transfer from the photosensitizer to the activator is efficiently achieved when the reduction potential of the dye is more negative than that of the activator. In addition, when the reduction potentials of the photosensitizer and activator are equal, electron transfer can still occur. Further, effective performance has been observed when the reduction potential of the photosensitizer is more positive than that of the activator to a limited degree.

In order then to select suitable dyes for the practice of the invention it is necessary to compare the reduction potentials of the azinium activator to be employed and the dye. In the overwhelming majority of instances precise determinations of reduction potentials are not required to ascertain that the proper relationship of reduction potentials exists. In those few instances in which the reduction potential of the dye is sufficiently positive with respect to that of the activator that a precise determination of reduction potentials is desired, it must be taken into account that reduction potentials can vary as a function of the manner in which they are measured. To provide a specific standard for reduction potential determinations, the procedure is employed described by J. Lenhard, "Measurement of Reversible Electrode Potentials for Cyanine Dyes for the Use of Phase-Selective Second Harmonic VC Voltammetry", Journal of Imaging Science, Vol. 30, No. 1, January/February 1986.

In addition to being directed to the use of dyes, including longer wavelength dyes, satisfying the reduction potential relationship set forth above as photosensitizers this invention specifically contemplates the use of keto dyes, particularly shorter wavelength keto dyes, which exhibit a low intersystem crossing efficiency to a triplet state—that is, an intersystem crossing efficiency of less than 10 percent. Stated another way, it is the recognition of the present invention that dyes having limited excited state lifetimes are nevertheless efficient photosensitizers.

The measurement of intersystem crossing efficiencies to a triplet state are generally known and reported in the art and form no part of this invention. Techniques for measurement of this parameter are well known in the art, as illustrated by Specht, Martic and Farid, "A New Class of Triplet Sensitizers", *Tetrahedron*, Vol. 38, pp. 1203-1211, 1982, and the references therein cited.

Known azinium activators can be employed in the practice of this invention. The azinium activators disclosed by Heseltine et al and Jenkins et al U.S. Pat. Nos. Re 27,922 and Re 27,925, Specht and Farid U.K. No. 2,083,832A, and *Research Disclosure*, Vol. 200, December 1980, Item 20036, each cited above, provide a variety of examples of useful azinium activators.

The azinium activators include an azinium nucleus, such as a pyridinium, diazinium, or triazinium nucleus. The azinium nucleus can include one or more aromatic rings, typically carbocyclic aromatic rings, fused with an azinium ring. In other words, the azinium nuclei include quinolinium, isoquinolinium, benzodiazinium, and naphthodiazonium nuclei. To achieve the highest attainable activation efficiencies per unit of weight it is preferred to employ monocyclic azinium nuclei.

A quaternizing substituent of a nitrogen atom in the azinium ring is capable of being released as a free radical upon electron transfer from the photosensitizer to the azinium activator. In one preferred form the quaternizing substituent is an oxy substituent. The oxy substituent (—O—R) which quaternizes a ring nitrogen atom of the azinium nucleus can be selected from among a variety of synthetically convenient oxy substituents. The moiety R can, for example, be an alkyl radical, such as methyl, ethyl, butyl, etc. The alkyl radical can be substituted. For example, aralkyl (e.g. benzyl and phenethyl) and sulfoalkyl (e.g., sulfomethyl) radicals are contemplated. In another form R can be an acyl radical, such as an —C(O)—R¹ radical, where R¹ can take any of the varied forms of alkyl and aralkyl radicals described above. In addition R¹ can be an aryl radical, such as phenyl or naphthyl. The aryl radical can in turn be substituted. For example, R¹ can be a tolyl or xylyl radical. R typically contains from 1 to 18 carbon atoms, with alkyl moieties in each instance above preferably containing from 1 to 8 carbon atoms and aryl moieties in each instance above containing 6 to 10 carbon atoms. Highest activity levels have been realized when the oxy substituent (—O—R) contains 1 or 2 carbon atoms.

The azinium nuclei need include no substituent other than the quaternizing substituent. However, the presence of other substituents is not detrimental to the activity of the activators. While it is known to include azinium nuclei substituents to increase blue light absorption by the activator directly, substituents capable of performing this function are not required.

It is a specific advantage of this invention that the dye photosensitizer can be relied upon for the absorption of light, and the azinium nuclei, apart from the quaternizing substituent, can be unsubstituted or, preferably, substituted with comparatively simple groups chosen for properties such as ease of synthetic or physical handling convenience, such as groups chosen from among substituted and unsubstituted aryl substituents of from 6 to 10 carbon atoms (e.g., phenyl or naphthyl) and substituted and unsubstituted alkyl and alkenyl groups of from 1 to 18 carbon atoms, preferably of from 1 to 8 carbon atoms. Activators free of a dye chromophore and therefore having limited ability to absorb visible light offer the advantage of improved stability when exposed to light during synthesis and/or handling. For example, these activators remain stable when synthesized and handled in unfiltered room light.

To the extent that substituents other than the quaternizing nitrogen atom substituent are present in the azinium salts employed, it is preferred that these substituents be electron withdrawing or neutral. When substituents other than the quaternizing nitrogen atom substituent are present which are electron donating, the effect is to shift the reduction potential of the activator to a more negative value. Since the photosensitizer has a reduction which in relation to that of the azinium salt activator is at most 0.1 volt more positive, it is apparent that electron donating substituents have the effect of limiting the selection of dyes which can be employed in combination as useful photosensitizers. However, there remain many dyes having sufficiently negative reduction potentials to be useful as photosensitizers in combination with azinium activators having electron donating substituents. Thus, a wide choice of substituents for the azinium salts employed in the present invention are possible. Subject to the considerations indicated above, suitable azinium ring substituents can be illustrated by any one or combination of the various substituents listed for the anilines described below.

Any convenient charge balancing counter-ion can be employed to complete the activator. Both weakly and highly dissociated counter-ions have been demonstrated to be useful. The counter-ion can be chosen for compatibility with the remaining components of the imaging system. For example, fluorinated carboxylate counterions, particularly perfluorinated carboxylate counterions, which are relatively undissociated, have been advantageously employed with azinium activators incorporated in oleophilic media, more specifically described below. Nevertheless, it is believed that highest levels of activity can be attributed to azinium activators which are ionically dissociated from charge balancing counter-ions in the imaging composition. While variances in ionic dissociation can be achieved by varied choices of solvents, film forming components, acidity, etc., in general higher levels of counter-ion dissociation occur with more electronegative counter-ions, such as hexafluorophosphate, tetrafluoroborate, perchlorate, para-toluenesulfonate, halide, sulfate, and similar electronegative anions.

In addition to activator and photosensitizer coinitiators it is additionally recognized that a third coinitiator, referred to as an enhancer, can optionally be included in the imaging composition. As is the subject of concurrently filed, commonly assigned U.S. Ser. No. 933,657, titled ENHANCED IMAGING COMPOSITION CONTAINING AN AZINIUM ACTIVATOR, it has been discovered that the imaging response of the imaging composition can be further improved by including as an enhancer coinitiator an aniline which is ring substituted with one or more groups capable of imparting a net Hammett sigma value derived electron withdrawing characteristic of at least +0.20 to the benzene ring. A positive Hammet sigma value is indicative of a substituent which is capable of rendering a phenyl ring electron withdrawing while a negative Hammet sigma value is indicative of a substituent which is capable of rendering a phenyl ring electron donating. Hydrogen is assigned a Hammett sigma value of zero. Lange's Handbook of Chemistry, 12th Ed., McGraw-Hill, 1979, Table 3-12, pp. 3-135 to 3-138, lists Hammett sigma values for a large number of commonly encountered substituents By algebraically summing the Hammet sigma values of the various ring substituents of the aniline (that is, the ring substituents other than the one required amine substituent) the net Hammett value derived electron withdrawing characteristic of the ring substituents can be determined.

It is to be noted that the amine substituent forming the aniline is an electron donating substituent. For example, the Hammett sigma values of a primary amine group ($-HN_2$); secondary amine groups, such as alkylamino (e.g., $-NHCH_3$, $-NHCH_2CH_3$, and $-NH\text{-}n\text{-}C_4H_9$); and tertiary amine groups, such as dialkylamino (e.g., $-NCH_3$) range from $-0.04$ to $-0.83$, but are generally more negative than $-0.20$. While it is not intended to be bound by any particular theory to account for the increased effectiveness imparted by the aniline initiator enhancers, it is believed that the molecular polarization created by the presence of both electron donating and electron withdrawing groups attached to the phenyl ring of the aniline can play a role in the observed increase in initiation activity.

In a preferred form the aniline contains a single ring substituent exhibiting a Hammett sigma value of greater than $+0.20$. The following illustrative substituents, with meta position Hammett sigma values shown parenthetically, are illustrative of useful electron withdrawing substituents which can be employed as the sole aniline ring substituent: cyano ($\sigma = +0.61$), alkylcarbonyl substituents (e.g., acetyl $\sigma = +0.38$ and trifluoroacetyl $\sigma = +0.65$), arylcarbonyl substituents (e.g., phenylcarbonyl $\sigma = +0.34$), oxycarbonyl substituents, including alkoxycarbonyl and aryloxycarbonyl substituents (e.g., methoxycarbonyl $\sigma = +0.32$, ethoxycarbonyl $\sigma = +0.37$), nitro ($\sigma = +0.71$), thiocyanato ($\sigma = +0.63$), perhaloalkyl substituents (e.g., trichloromethyl $\sigma = +0.47$ and trifluoromethyl $\sigma = +0.47$), perfluoroalkylthio substituents (e.g., trifluoromethylthio $\sigma = +0.35$), sulfamoyl substituents, including alkylsulfamoyl and arylsulfamoyl substituents (e.g., sulfamoyl $\sigma = +0.46$), carbonylthio substituents (e.g., acetylthio $\sigma = +0.39$), carbamoylthio substituents (e.g., carbamoylthio $\sigma = +0.34$), oxythio substituents, including alkoxythio and aryloxythio substituents (e.g., methoxythio $\sigma = +0.52$), and sulfonyl substituents, including alkylsulfonyl and arylsulfonyl substituents (e.g., methylsulfonyl $\sigma = +0.68$ and phenylsulfonyl $\sigma = +0.67$). Multiple ring substitutions with these substituents are contemplated.

In addition to the highly electron withdrawing substituents identified above the aniline ring can, but need not, include ring substituents having Hammett sigma value derived electron withdrawing characteristics less positive than $+0.20$, provided a net Hammett sigma value derived electron withdrawing characteristic of at least $+0.20$ is maintained. Exemplary simple substituents and their published meta Hammett sigma values are primary and second alkyl substituents, such as methyl $\sigma = -0.07$, ethyl $\sigma = -0.07$, n-propyl $\sigma = -0.05$, i-propyl $\sigma = -0.07$, n-butyl $\sigma = -0.07$, and sec-butyl $\sigma = -0.07$. These alkyl substituents are synthetically convenient and therefore contemplated, though electron donating. Alkyl substituents containing tertiary carbon atoms and particularly tertiary alkyl groups tend to be even more highly electron donating and are not preferred. Aryl groups such as phenyl, $\alpha$-naphthyl, and $\beta$-naphthyl groups are contemplated (e.g., phenyl $\sigma = +0.06$). Other useful and specifically contemplated hydrocarbon substituents include alkaryl substituents (e.g., p-methylphenyl), aralkyl substituents (e.g., benzyl $\sigma = -0.05$ and phenethyl), alkenyl substituents (e.g. vinyl $\sigma = +0.02$), aralkenyl substituents (e.g., 2-phenyl-vinyl $\sigma = +0.14$), alkynyl substituents (e.g., ethynyl $\sigma = +0.21$, propargyl, and 2-butynyl), and aralkynyl substituents (e.g., phenethynyl $\sigma = +0.14$). Substituted hydrocarbon substituents are also contemplated, such as haloalkyl substituents (e.g., bromomethyl, chloromethyl $\sigma = -0.12$, fluoromethyl, and iodomethyl), haloaryl substituents (e.g., p-bromophenyl, m-bromophenyl, and p-chlorophenyl, and hydroxyalkyl substituents (e.g., hydroxymethyl $\sigma = +0.08$). Oxy substituents or substituent moieties of hydrocarbon substituents are specifically contemplated—i.e., hydroxy ($\sigma = +0.10$), alkoxy (e.g., methoxy $\sigma = +0.14$, ethoxy $\sigma = +0.07$, n-propoxy $\sigma = +0.07$, i-propoxy $\sigma = 0.00$, n-butoxy $\sigma = -0.05$, cyclohexoxy $\sigma = +0.29$, cyclohexylmethoxy $\sigma = +0.18$, and trifluoromethoxy $\sigma = +0.36$), and aryloxy (e.g., phenoxy $\sigma = +0.25$). Halogen substituents are contemplated—i.e., bromo ($\sigma = +0.39$), chloro ($\sigma = +0.35$), fluoro ($\sigma = +0.34$), and iodo ($\sigma = +0.35$). Amido substituents are also contemplated, such as amido ($\sigma = +0.25$), methylamido ($\sigma = +0.21$), phenylamido ($\sigma = +0.22$), and ureido ($\sigma = +0.18$).

When electron donating or weakly electron withdrawing substituents are employed, they are in every instance employed in combination so that the net Hammett sigma derived value of the various substituents other than the one required amino substituent forming the aniline is greater than $+0.20$. While meta position Hammett sigma values have been provided, in most instances para position Hammett sigma values are not highly different and can, in any event, be determined by reference to published lists. Ortho Hammett sigma values are usually essentially identical to para position Hammett sigma values. Meta, ortho, and para positions for the various substituents to the aniline are assigned with reference to the position of the amino group forming the aniline. To minimize molecular bulk it is generally preferred that the aliphatic moieties of the various ring substituents each contain 6 or fewer carbon atoms and that the aromatic moieties each contain 10 or fewer carbon atoms.

In addition to the coinitiators described above the imaging system includes an imaging dye or dye precursor and a hardenable organic component containing ethylenic unsaturation sites. In a simple illustrative form the hardenable organic component can take the form of an organic film forming component of a negative-working photoresist having the imaging dye or its precursor blended therewith.

The organic film forming component can take the form of any containing ethylenic unsaturation and capable of selective immobilization by undergoing an addition reaction at the site of the ethylenic unsaturation. Hardening of the film forming component and thus immobilization of the blended imaging dye or dye precursor can be imparted by initiating polymerization of monomers containing ethylenic unsaturation or by initiating crosslinking of linear polymers or oligomers containing ethylenic unsaturation. For example, any of the monomeric or crosslinkable polymeric film forming components disclosed in Jenkins et al and Heseltine et al U.S. Pat. No. Re. 27,925 or Re. 27,922, respectively, are suitable for use in the photoresists of this invention and are here incorporated by reference. Tan et al U.S. Pat. No. 4,289,842, here incorporated by reference, discloses negative working photoresists containing light sensitive acrylate copolymers containing pendant groups, such as alkenyl groups with ethylenic unsaturation. Lindley U.S. Pat. No. 4,590,147, here incorporated by reference, discloses vinyl oligomers which can be employed as film forming components in the photoresists in this invention. Useful film forming components containing vinyl monomers are disclosed in Fuerniss U.S. Pat. No. 4,497,889 and Anderson et al U.S. Pat. No. 4,535,052, both here incorporated by reference. Kosar *Light-Sensitive Systems*, John Wiley & Sons, 1965, further describes a variety of useful film forming components for use in the practice of this invention, including ethylenically unsaturated monomers and polymers.

Preferred film forming components are comprised of at least one addition polymerizable ethylenically unsaturated compound having a boiling point above 100° C. at normal pressure which is preferably employed in combination with a polymeric binder. The ethylenically unsaturated compound (typically a monomer) and the polymeric binder can be employed together in widely varying proportions, including ethylenically unsaturated compound ranging from 3 to 97 percent by weight of the film forming component and polymeric binder ranging from 97 to 3 percent by weight of the film forming component. A separate polymeric binder, though preferred, is not an essential part of the film forming component and is most commonly omitted when the ethenically unsaturated compound is itself a polymer.

Chang U.S. Pat. No. 3,756,827, here incorporated by reference, discloses in column 2, line 36 to column 3, line 30, a variety of suitable organic monomers for use in the photoresists of this invention. Specifically illustrated in the examples below are ester monomers containing ethylenic unsaturation. Similar monomers include ethylenically unsaturated diester polyhydroxy polyethers, described in Chambers U.S. Pat. No. 4,245,031, here incorporated by reference.

Organic polymeric binders which can form a part of the film forming component of the photoresist include: (1) polyesters, including those based on terephthalic, isophthalic, sebacic, adipic, and hexahydroterephthalic acids; (2) nylons or polyamides; (3) cellulose ethers and esters; (4) polyaldehydes; (5) high molecular weight ethylene oxide polymers—e.g., poly(ethylene glycols), having weight average molecular weights from 4000 to 4,000,000; (6) polyurethanes; (7) polycarbonates; (8) synthetic rubbers—e.g., homopolymers and copolymers of butadienes; and (9) homopolymers and copolymers formed from monomers containing ethylenic unsaturation, such as polymerized forms of any of the various ethylenically unsaturated monomers, such as polyalkylenes—e.g. polyethylene and polypropylene; poly(vinyl alcohol); poly(vinyl esters)—e.g., poly(vinyl acetate); polystyrene; poly(acrylic and methacrylic acids and esters);13 e.g., poly(methyl methacrylate) and poly(ethyl acrylate), as well as copolymer variants.

In addition to the film forming component and the coinitiators the negative-working photoresist contains an imaging dye or an imaging dye precursor. The imaging dye or its precursor can be present in any concentration which imparts a visually discernable coloration to the photoresist when coated on a substrate, exposed to imaging radiation, and then developed. Useful imaging dye concentrations can vary widely, depending upon a variety of factors, such as the extinction coefficient of the dye, the degree of color saturation desired, the manner in which the dye is dispersed, and the dispersing medium.

To achieve highest levels of sensitivity it is generally preferred to choose the imaging dye or its precursor to avoid competition or interaction with the photosensitizer. For example, with an imaging dye present in the imaging system during imagewise exposure if the imaging dye absorbs at the same wavelength as the photosensitizer, the speed of the system is reduced to the extent that the imaging dye captures photons which would otherwise be captured by the photosensitizer. Therefore, it is apparent that the imaging dye, where present during imagewise exposure, is preferably chosen to exhibit a maximum absorption peak in a different portion of the spectrum than the photosensitizer. For instance a cyan (red absorbing) photosensitizer employed with a yellow (blue absorbing) imaging dye exhibits higher levels of sensitivity than when the imaging dye is also a cyan dye. Further, to reduce the possibility of interactions between the photosensitizer and the imaging dye, it is preferred that the imaging dye have an absorption peak at a shorter wavelength than the photosensitizer. With such a relationship the imaging dye is responding to higher energy (shorter wavelength) radiation than the photosensitizer and therefore not likely to interfere with the interaction of the photosensitizer and activator.

Subject to the above considerations imaging dyes can be selected from among the various known classes of dyes. The imaging dyes are preferably selected from among the more light stable dyes, such as azo dyes, anthracene dyes, and the like. The imaging dyes are preferably selected to remain substantially inert during the photohardening step.

In a specific preferred form of the invention, instead of incorporating an imaging dye in the photoresist an imaging dye precursor, such as a leuco dye or other chromogenic material described more specifically below in connection with more elaborate imaging systems, can be employed. The use of a dye precursor which is substantially colorless at the stage of imagewise exposure has the advantage that the dye precursor does not absorb exposing radiation and hence does not compete with the photosensitizer. In other words, higher levels of sensitivity can be realized when a dye precursor is employed for imaging as compared with an imaging dye. For example, an image dye which absorbs at the same wavelength as the photosensitizer does not compete with the photosensitizer for photons when a dye precursor is employed so that the image dye chromophore is not formed until after imagewise exposure has occurred.

In addition to the film forming component, the coinitiators, and the imaging dye or dye precursor the photoresists can contain any one or combination of known addenda, such as thermal inhibitors, supplemental colorants (e.g., pigments), plasticizers, fillers, etc. To facilitate coating on a substrate the photoresist is usually dispersed in a solvent to create a solution of slurry, the liquid being evaporatively removed after coating. Any solvent can be employed for this purpose which is inert toward the film forming components and addenda of the photoresist. Solvents can be chosen from among a wide variety of organic liquids, including N,N-dimethylformamide; N,N-dimethylacetamide; alcohols, such as methanol, ethanol, butanol, etc.; ketones, such as acetone, cyclohexanone, and butanone; esters, such as ethyl acetate and ethyl benzoate; ethers, such as tetrahydrofuran and dioxane; chlorinated aliphatic hydrocarbons, such as methylene chloride and 1,2-dichloroethane; aromatic hydrocarbons, such as benzene and toluene; and other common solvents, such as dimethyl sulfoxide, chlorobenzene, and various mixtures of solvents.

Any conventional ratio of activator to film forming component can be present in the photoresists of this invention. Activator concentrations are as a practical matter most conveniently specified in terms of moles of activator per gram of dry solids, the latter consisting of the film forming component and the minor amounts of various addenda, but excluding any liquid component introduced to facilitate coating. Typically from about $2 \times 10^{-5}$ to $25 \times 10^{-5}$, most preferably from about $5 \times 10^{-5}$ to $20 \times 10^{-5}$ mole of activator is present per gram of dry solids.

In the practice of the present invention the enhancer is an optional coinitiator, meaning that it need not be present or need not be present in an effective amount. However, it is generally preferred to incorporate the enhancer in any convenient effective amount. Typically from about 0.1 to 10 moles per mole of activator are employed. The use of larger amounts is, of course, possible.

The photosensitizer can be present in any concentration capable of increasing the response of the photoresist to visible light. While the photosensitizer concentration can vary widely, it is generally contemplated to photosensitize in concentrations ranging from about $5 \times 10^{-7}$ to $1 \times 10^{-4}$ mole per gram of dry solids. Preferred photosensitizer concentrations are in the range of from $10^{-6}$ to $5 \times 10^{-5}$ mole per gram of dry solids, with optimum concentrations generally being in the range of from about $2 \times 10^{-6}$ to $2 \times 10^{-5}$ mole per gram of dry solids.

The substrate onto which the photoresist is coated can take any convenient conventional form. For imaging, transparent and white reflective substrates are particularly advantageous; however, any substrate which does not exactly match the hue of image dye can be employed. Substrates such as glass, ceramic, metal, cellulose paper, fiberboard, semiconductor, or polymer substrates are illustrative. Specific substrates include alumina-blasted aluminum, anodized aluminum, alumina-blasted poly(ethylene terephthalate) film, poly(ethylene terephthalate) film, flame or electrostatic discharge treated poly(ethylene terephthalate) film, poly(vinyl alcohol)-coated paper, crosslinked polyester-coated paper, nylon, glass, cellulose acetate film, heavy paper, such as lithographic paper, and the like.

In perhaps their most commonly used form photoresists are coated in a fluid form on a substrate and evaporatively dried, usually with heating, to produce a uniform coating. Often, particularly in the manufacture of semiconductor devices, the substrate is spun, thereby employing centifugal forces to assure the uniformity of the photoresist coating before drying. After exposure to visible radiation causes addition to occur at the ethylenic unsaturation sites of the film forming component, a liquid developer is brought into contact with the coated substrate to remove selectively the photoresist in areas which were not exposed to actinic radiation.

The liquid developer can be any convenient liquid which is capable of selectively removing the photoresist in unexposed areas. The coated photoresist can be sprayed, flushed, swabbed, soaked, or otherwise treated with the developer to achieve selective removal. In its simplest form the liquid developer can be the same liquid employed as a solvent in coating the photoresist. Methoxyethyl acetate and ethoxyethyl acetate are common developers. Also aqueous developers are commonly employed, such as miscible combinations of water and alcohols, with proportions in the range of from 20 to 80 percent water and 80 to 20 percent alcohol being common. Exemplary water miscible alcohols include glycerol, benzyl alcohol, 1,2-propanediol, sec-butyl alcohol, and ethers derived from glycols, such as dihydroxy poly(alkylene oxides). Lactone developers, such as those disclosed by Martinson et al U.S. Pat. No. 3,707,373, can be employed. Optimum developer choices for specific photoresists are disclosed in the various patents cited above illustrating the specific film forming components.

Following development a retained dye image is presented by the photoresist coating remaining on the substrate. The colored areas correspond to the areas of exposure. Multicolor images, such as images employed for color proofing, can be produced by superimposing three elements each comprised of a transparent support and a photoresist image, where each image is formed by a different additive or subtractive primary dye.

In the foregoing imaging systems only a single coated layer is required for imaging. However, it is recognized that the imaging systems of the invention can employ multiple layers. For example, instead of blending the imaging dye with the film forming component as described above, a separate imaging dye layer can be coated between the substrate and the photoresist layer. Upon imagewise exposure and development the photoresist is removed in exposed areas. Where the photoresist remains the underlying image dye remains in its initial immobilized condition, while in other areas the dye can be removed or decolorized by washing or any other convenient technique.

Instead of forming retained dye images with photoresist coatings as described above, it is specifically contemplated to form transferred dye images. For example, instead of removing the film forming component of the photoresist layer in unexposed areas by development following imagewise hardening, the unhardened areas of the photoresist layer or only the imaging dye or dye precursor contained in these areas can be selectively transferred to a receiver. For example, the greater tackiness of the unhardened areas can be relied upon to permit their transfer by first laminating the imagewise exposed layer to a receiver sheet and then stripping. In another approach, the hardened portions of the imagewise exposed layer can be relied upon to reduce the mobility of the image dye or dye precursor so that imaging dye is transferred to or formed in the receiver only in areas corresponding to unexposed areas of the photoresist layer. Other variant approaches to forming transferred images should be apparent from the description of other imaging systems below.

In the foregoing description of photoresists the hardenable organic component containing ethylenic unsaturation sites is a film forming component. However, in certain preferred imaging systems of the invention the hardenable organic component can be present as a discontinuous or internal phase forming microcapsules which can be in contact with a surrounding continuous phase or separated therefrom by intervening rupturable encapsulating walls. While it is possible to coat microcapsules each containing the hardenable organic component, coinitiators, and imaging dye or dye precursor to form a single color image, the present invention makes possible the formation of multicolor images employing a single layer of microcapsules coated on a support. Since the microcapsules form discrete packets of materials, it is possible to mix in the same layer microcapsules containing dye photosensitizers which absorb at differing locations in the visible spectrum and imaging dyes (or their precursors) of differing imaging hues. For example, it is contemplated to coat as a single layer on a substrate (a) microcapsules containing a yellow dye photosensitizer and a yellow or blue imaging dye or its precursor, (b) microcapsules containing a magenta dye photosensitizer and a magenta or green imaging dye or its precursor, and (c) microcapsules containing a cyan dye photosensitizer and a cyan or red imaging dye or its precursor. Except for the choice of dye photosensitizer and imaging dye the microcapsules can be otherwise identical. Thus, merely by blending three differing populations of microcapsules it is possible to obtain multicolor images with the same ease and facility as monochromic dye images are obtained. Except for hue selection of components and blending of microcapsule populations prior to coating, monochromic and multicolor imaging according to this invention are identical. Therefore, for simplicity the description which follows is in terms of monochromic imaging, but the description is applicable to both monochromic and multicolor imaging, except as specifically noted.

The microcapsules can be employed to produce either a retained or a transferred dye image. Further, either a preformed dye or, preferably, a dye precursor can be contained in the microcapsules.

In the retained imaging system a receiver layer is coated on a substrate and is overcoated by a layer of microcapsules. Within each coated microcapsule exposure to light which is absorbed by the dye photosensitizer results in release of a free radical by the azinium activator which in turn results in hardening of the organic component containing ethylenic unsaturation. Subsequent uniform rupture of all the coated microcapsules, as by passing the exposed element between pressure rollers, results in migration of imaging dye or its precursor from the microcapsules which were not exposed and hence were not internally hardened.

The released dye or dye precursor diffuses into the receiver layer. Where an imaging dye is contained in the microcapsules, the receiver layer can be formed of any convenient transparent dye penetrable material. For example, the dye can enter a hydrophilic colloid layer or film forming polymer layer. Preferably a mordant is present in the receiver layer to immobilize the image dye on receipt.

When the microcapsules contain a dye precursor, the dye image forming layer contains a second component capable of interacting with the dye precursor to form the image dye. One of the two components is hereinafter referred to as a chromogenic material and the other is referred to as a developer. Either or both can be viewed as a dye precursor and either can be located within the microcapsules with the other located in the dye image forming layer in monochromic imaging. However, for multicolor imaging the chromogenic materials, which differ based on the hue of the dye to be produced, are located within the microcapsules. For simplicity subsequent discussion is directed to chromogenic materials contained in the microcapsules with developer being located in the receiver layer, but the converse arrangement is possible, except as specifically noted. The receiver layer can be similar to the receiver for a preformed imaging dye, differing only by the additional inclusion of a developer.

Transferred dye image systems can be similar to the retained dye image systems described above, but differ in the location of the receiver layer. Instead of coating the receiver layer on the same support as the microcapsules, the receiver layer is coated on a separate support. In integral format arrangements the receiver layer and its support can be associated with the microcapsule layer and its support at the time of exposure as well as at the time transfer to the receiver from the microcapsules occurs. Alternatively, the receiver layer and its support need not be associated with the microcapsule layer until rupture of the microcapsules occurs. In either arrangement the receiver layer and its support can be employed alone as the image bearing element or can be retained with the microcapsule layer and its support. In the latter instance the decolorization of the photosensitizer by room light in the image bearing element and the initially colorless form of the chromogenic material are particularly advantageous.

In general similar materials can be employed in forming the microcapsule systems described above as have been previously described in connection with negative-working photoresists, the principal difference being in the physical continuity of the imaging layer. However, certain materials described below have been found to be particularly well suited to use in microcapsule imaging systems and constitute preferred materials.

Preferred hardenable organic components containing ethylenic unsaturation include compounds containing at least one terminal ethylenic group per molecule and preferably two or more terminal ethylenic groups per molecule. Typically they are liquid and can also double as a carrier oil for the chromogenic material in the internal phase. Representative examples of these compounds include ethylenically unsaturated acid esters of polyhydric alcohols such as trimethylol propane triacrylate. Another preferred hardenable component can include an acrylate prepolymer derived from the partial reaction of pentaerythritrol with acrylic acid or acrylic acid esters. Such materials are available from Richardson Company, Melrose Park, Ill.—e.g., R1-1482 and R1-1483. Also useful are isocyanate modified acrylate, methacrylate, and itaconic acid esters of polyhydric alcohols, such as disclosed by Carlick et al U.S. Pat. Nos. 3,825,479; 3,759,809; and 3,783,151.

The chromogenic materials used in the present invention are preferably oil soluble color formers which produce a dye upon reaction with a developer in the presence of a carrier oil. Representative examples of such chromogenic materials include substantially colorless compounds including a lactone, lactam, sultone, spiropyran, ester, or amido structure. Specifically preferred chromogenic materials are triarylmethane, bisphenylmethane, xanthene, thiazine, spiropyran, and similar compounds. Also useful as chromogenic materials are organic compounds capable of complexing with heavy metals to form dyes—e.g., copper phthalocyanine. Specific chromogenic materials, including specific additive and substractive primary dye forming chromogenic materials, are disclosed in U.S. Pat. Nos. 3,920,510; 4,399,209; and 4,440,846, here incorporated by reference.

In addition to the hardenable organic component, the coinitiators, and the chromogenic material, the discrete phase or microcapsules can also contain a carrier oil. Preferred carrier oils are weakly polar solvents having boiling points above 170° C. and preferably in the range of from 180° C. to 300° C. Exemplary carrier oils include alkylated biphenyls (e.g., monoisopropylbiphenyl), polychorinated biphenyls, caster oil, mineral oil, deodorized kerosene, naphthenic mineral oils, dibutyl phthalate, dibutyl fumerate, brominated paraffin, and mixtures thereof. Alkylated biphenyls are preferred on the basis of low toxicity while brominated paraffins employed in combination with trimethylol propane triacrylate are particularly preferred for halftone imaging.

Carrier oils are not required. As previously noted the hardenable organic component can in many instances perform the mobility providing function of a carrier oil, particularly where the hardenable organic component is a monomer. The choice of carrier oil will depend to some extent on the chromogenic material to be transported on rupture of the microcapsule. Carrier oils are chosen on the basis of their ability to impart mobility to the chromogenic material in the absence of hardening of the organic component containing ethylenic unsaturation as well as being nonreactive with the various components of the microcapsules.

The internal phase forming the microcapsules is then comprised of the hardenable organic component, an optional carrier oil, a chromogenic material, coinitiators, and any of a variety of optional components intended to offer improvement in imaging properties, such as light scattering materials, stabilizers, and the like.

The materials forming the internal phase of the microcapsules can be present in generally similar concentration ranges as previously described in connection with photoresists. In general the hardenable organic component constitutes at least about 40 percent by weight of the internal phase and typically constitutes from about 50 to 99 percent by weight of the internal phase. The chromogenic material can be present in any concentration compatible with providing a visible dye image. In general useful concentrations range from about 0.5 to 20.0 percent by weight, based on the weight of the internal phase. A preferred range of chromogenic material for monochromic imaging is from about 2 to 7 percent by weight of the internal phase. In multicolor imaging a somewhat higher concentration of chromogenic material is preferred, since only a third of the microcapsules are available to provide a maximum image dye density of any primary hue. For example, a maximum density magenta image must be formed using only the one third of the microcapsules containing the chromogenic material which forms a magenta dye. A preferred range of chromogenic material for multicolor imaging is from about 5 to 15 percent by weight of the internal phase. Carrier oils are not required, but can be present in concentrations of up to about 50 percent by weight of the internal phase, preferably in concentrations of from about 10 to 40 percent of the internal phase. The coinitiators can be present in the same concentrations set out above for the photoresists, where the dry solids percentage bases correspond to internal phase percentage bases for the microcapsule utility.

In preferred forms the microcapsules each include in addition to the internal phase a rupturable surrounding encapsulating wall. Encapsulation can be undertaken in any convenient conventional manner. Oil soluble chromogenic materials have been encapsulated in hydrophilic wall forming materials, such as gelatin and gelatin derivatives (e.g., phthalated gelatin), gum arabic, poly(vinyl alcohol), and carboxymethylcellulose wall forming materials, as illustrated by Green et al U.S. Pat. Nos. 2,730,456 and 2,800,457; resorcinol-formaldehyde wall formers, as illustrated by Vassiliades U.S. Pat. No. 3,914,511; isocyanate-polyol wall formers, as illustrated by Kiritani et al U.S. Pat. No. 3,796,669; urea-formaldehyde wall formers, particularly urea-resorcinol-formaldehyde wall formers, as illustrated by Foris et al U.S. Pat. Nos. 4,001,140, 4,087,376, and 4,089,802; melamine-formaldehyde resin wall formers; and hydroxypropyl cellulose wall formers, as illustrated by Shackle U.S. Pat. No. 4,025,455; all of the foregoing patents being here incorporated by reference. The wall formers must, of course, be capable of transmitting exposing radiation. Preferred wall formers are gelatin and gelatin derivatives as well as urea-resorcinol-formaldehyde wall formers. Microencapsulation can be accomplished by any convenient conventional technique, including coacervation, interfacial polymerization, polymerization of one or more monomers in oil, as well as various melting dispersing, and cooling methods.

The microcapsules normally are chosen to be of a size too small to be individually discerned by the unaided eye. The microcapsules preferably range from about 1 to 25 micrometers ($\mu$m) in diameter, more typically from about 3 to 15 $\mu$m in diameter, depending upon the sharpness of the image desired, the smoothness of the support surface, and the technique used for rupturing the microcapsules. Generally the sharpness of the dye image increases as the size of microcapsules decreases. However, smaller microcapsules are less easily coated on rough surface supports and less easily ruptured uniformly by mechanical techniques.

The microcapsules are normally coated at a density sufficient to at least cover the surface of the support. That is, based on the average diameter of the microcapsules the coating coverage is chosen to provide at least a monolayer coverage of microcapsules on the support.

Instead of forming the microcapsules with discrete walls, it is appreciated that microcapsule containing compositions suitable for coating on a substrate can be produced by forming an emulsion in which the microcapsules constitute the discontinuous or internal phase and a binder analogous to the wall formers above constitutes the continuous phase. For example, such microcapsule coatings can be formed employing hydrophilic binders, such as hardened gelatin and gelatin derivatives.

Reacting with the chromogenic material (or first dye precursor) is a developer (or second dye precursor). The developer can take the form of any material capable of reacting with the chromogenic material to produce a dye. For the preferred classes of chromogenic materials identified above illustrative developers include clay minerals, such as acid clay, and active clay attapulgite; organic acids such as tannic acid, gallic acid, and propyl gallate; acid polymers, such as phenol-formaldehyde resins; condensates of carboxylic acids containing at least one hydroxy group and formaldehyde; metal salts of aromatic carboxylic acids, such as zinc salicylate, tin salicylate, zinc 2-hydroxynaphthenoate, zinc 3,5-di-tert-butylsalicylate; oil soluble metal salts of phenol-formaldehyde novolak resins (more specifically illustrated by U.S. Pat. Nos. 3,672,935; 3,732,120; and 3,737,410), zinc carbonate, and mixtures of the above.

When the developer is coated on a substrate, as is preferred, the developer is typically dispersed in a binder. The binder is chosen to be a relatively dye permeable inert material, such as poly(vinyl alcohol), gelatin or a gelatin derivative, maleic anhydride-styrene copolymer, starch, gum arabic, or a cellulose ester. In general well known film forming binders are useful. As mentioned above, a mordant can be incorporated in the binder for the developer to assist in immobilizing the dye once it is formed. A variety of mordants particularly compatible with gelatin and gelatin derivatives are disclosed by Hartman U.S. Pat. No. 4,315,978.

While the microcapsule containing imaging system has been described above in terms of employing a chromogenic material and a developer, it is appreciated that mobile imaging dyes can be substituted for the the chromogenic material, if desired. The advantage of employing chromogenic materials is that the chromogenic material need contain no chromophore to compete with the dye photosensitizer for photon dye capture. Further, the chromogenic material minimizes coloration of the imaging system in areas where no image dye is formed.

While the preferred microcapsule imaging systems above have been described in terms of forming a discontinuous oleophilic phase in a continuous hyrophilic phase, it is appreciated that the reverse relationship is also possible. It is specifically contemplated to form microcapsules containing dyes or chromogenic materials which are more hydrophilic and to rely on the relative hydrophobicity if not impermeability of the microcapsule walls to initially confine the dyes. Where microcapsule wall formers are present, the same relatively hydrophilic binders described above can still be employed. The important point to note is that an extremely broad range of imaging dyes and chromogenic materials are available for use. Hartman U.S. Pat. No. 4,315,978 illustrates a variety of yellow, magenta, and cyan dyes containing polar substituents to impart mobility in more hydrophilic media.

EXAMPLES

The invention can be better appreciated by reference to the following specific examples.

EXAMPLES 1 THROUGH 35

A series of negative working photoresist compositions PR-1 each containing 0.02 millimole of a different dye being tested as a photosensitizer were prepared.

PR-1 was formulated as follows:
2.34 g Binder A
1.17 g Monomer A
1.17 g Monomer B
0.012 g Inhibitor A
0.077 g Activator A
0.02 mmol Photosensitizer
10.32 g Solvent (Dichloromethane)

Binder A exhibited the following structure

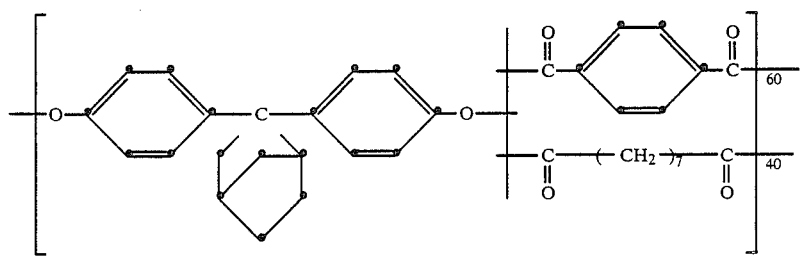

Monomer A exhibited the following structure

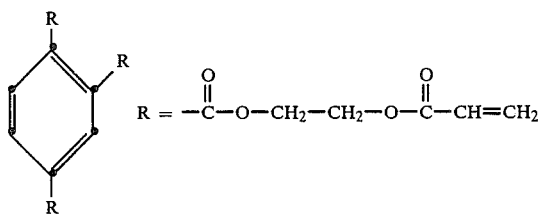

Monomer B exhibited the following structure

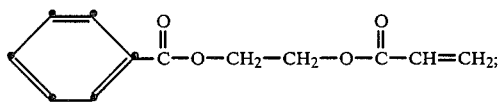

Inhibitor A exhibited the following structure

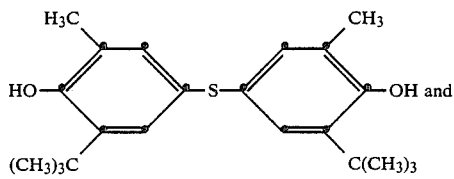

Activator A was 1-methoxy-4-phenylpyridinium tetrafluoroborate.

Each of the photoresist compositions was coated on a copper sheet using a 0.3 mm coating knife and dried for 10 minutes at about 70° C. A transparent polypropylene cover sheet was then placed over the coating.

Since PR-1 without the photosensitizer coninitiator responds to ultraviolet exposures, shorter wavelengths were removed during exposure using filters. Specifically, wavelengths below the absorption peak of the photosensitizer dye were removed using a W-2A, W-16, or W-25 Wratten ® filter capable of filtering 99.9 percent of radiation of less than 400, 510, or 580 nm in wavelength, respectively.

To determine the degree of effectiveness of the photosensitizer exposure of each coated sample was undertaken through a Kodak T-14 ® step tablet having 14 equal increment density steps ranging in density from essentially zero to 2.1. Three minute exposures were undertaken using a Nu-arc FT32L ® flip-top platemaker equipped with a 4000 watt pulsed Xenon lamp. After exposure the samples were baked for 10 minutes at 70° C. and spray developed for two minutes. Development was undertaken using 1,1,1-trichloroethane as a developer. Response was measured in terms of the number of stepped exposure areas (steps) in which the photoresist was retained following exposure. For example, a photoresist sample which was retained following exposure and development on 10 steps, but was absent from the remaining four steps was assigned a step rating of 10. If partial retention of the photoresist was observed on the eleventh step, this was indicated by assigning a plus rating—i.e., 10+. On the other hand, where the photoresist retention was deemed just barely adequate to merit the step rating, this was indicated by assigning a minus rating—i.e., 10—.

Results with the various dyes are indicated below in Table I, which reports the absorption peak of the dye in the coating and the step range of response. Activator A exhibited a reduction potential of −0.75 volt, and each of the dye photosensitizers exhibited a reduction potential less than 0.1 volt more positive than the reduction potential of Activator A.

When control formulations of PR-1 were prepared varied only by omitting Activator A, so that the dye was the sole initiator present, little or no imaging response was observed. This showed the dye photosensitizers to be relatively ineffective when employed as the sole initiators.

When control formulations of PR-1 were prepared varied only by omitting the dye, so that Activator A was the sole initiator present, performance of the procedure described above and including the filtering used with the dyes resulted in no imaging response being observed. This showed the activator to be ineffective to impart sensitivity to the photoresist in the blue portion of the spectrum.

The dyes employed as photosensitizers, their reduction potentials, and the number of steps of retained photoresist after development are shown in Table I. In every instance the keto dyes listed in Table I exhibit an intersystem crossing efficiency to a triplet state of less than 10 percent.

TABLE I

| | R | X⁻ | λ-max | $E_{red}$ | Steps |
|---|---|---|---|---|---|
| PS-1 | —C₁₆H₃₃ | I⁻ | 430 | −1.45 | 6+ |
| PS-2 | —C₁₈H₃₇ | PTS⁻ | 432 | −1.45 | 6− |
| PS-3 | —CH₂CH=CH₂ | Br⁻ | 432 | ca − 1.45 | 7 |
| PS-4 | | I⁻ | 453 | −1.28 | 6+ |
| PS-5 | | I⁻ | 503 | | 7+* |

| | R | X⁻ | λ-max | $E_{red}$ | Steps |
|---|---|---|---|---|---|
| PS-6 | —CH₂CH₃ | I⁻ | 532 | −1.13 | 2 |
| PS-7 | —C₄H₉ | I⁻ | 532 | −1.13 | 2 |
| PS-8 | —C₅H₁₁ | I⁻ | 532 | −1.13 | 2 |
| PS-9 | | Cl⁻ | 502 | −1.30 | 10* |
| PS-10 | | ClO₄⁻ | 484 | −1.86 | 9* |

TABLE I-continued
| | | | | | |
|---|---|---|---|---|---|
| PS-11 | 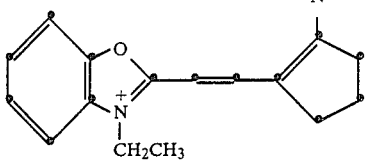 | ClO$_4^-$ | 485 | ca − 1.36 | 10* |
| PS-12 | 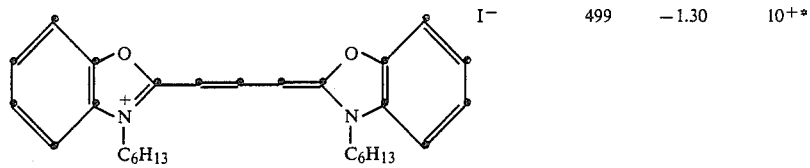 | I$^-$ | 499 | −1.30 | 10$^{+*}$ |
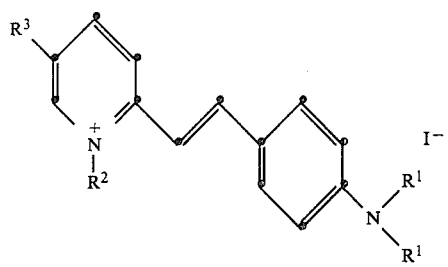
| | R$^1$ | R$^2$ | R$^3$ | λ-max | E$_{red}$ | Steps |
|---|---|---|---|---|---|---|
| PS-13 | —CH$_3$ | —CH$_3$ | H | 468 | −1.19 | 10$^{+*}$ |
| PS-14 | —CH$_3$ | —CH$_3$ | —C$_2$H$_3$ | 462 | −1.09 | 12$^{-*}$ |
| PS-15 | —C$_3$H$_7$ | —CH$_3$ | H | 480 | −1.23 | 12$^{-*}$ |
| | | | | | |
|---|---|---|---|---|---|
| PS-16 | 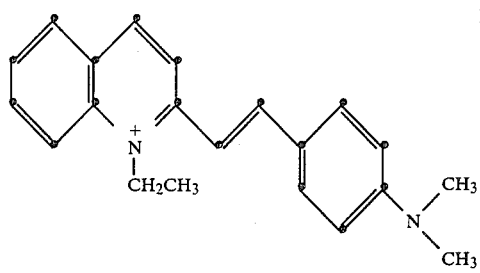 | I$^-$ | 535 | −0.88 | 8* |
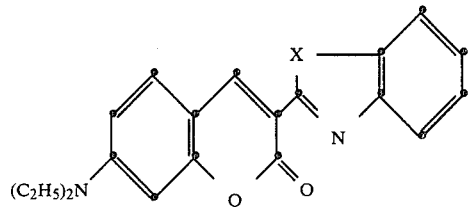
| | n | R′ | R | X$^-$ | λ-max | E$_{red}$ | Steps |
|---|---|---|---|---|---|---|---|
| PS-17 | 1 | —CH$_3$ | C$_2$H$_5$ | I$^-$ | 494 | −1.1 | 11$^{+*}$ |
| PS-18 | 1 | (CH$_2$)$_3$SO$_3$— | C$_5$H$_{11}$ | — | 496 | −1.14 | 12$^{+*}$ |
| PS-19 | 1 | (CH$_2$)$_4$SO$_3$— | C$_5$H$_{11}$ | — | 497 | −1.14 | 12$^{+*}$ |
| PS-20 | 2 | (CH$_2$)$_4$SO$_3$— | C$_5$H$_{11}$ | — | 508 | −1.07 | 10$^{+*}$ |
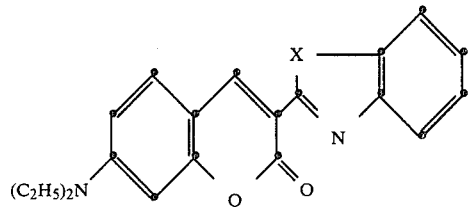
| | | λ-max | E$_{red}$ | Steps |
|---|---|---|---|---|
| PS-21 | X = S | 467 | −1.36 | 11$^{-*}$ |
| PS-22 | X = NH | 450 | −1.48 | 10$^-$ |
| PS-23 | X = NCH$_3$ | 420 | −1.60 | 10$^+$ |

TABLE I-continued
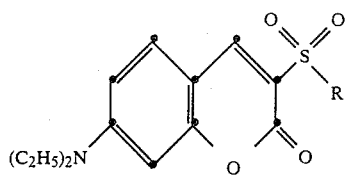
|   | R | λ-max | $E_{red}$ | Steps |
|---|---|---|---|---|
| PS-24 | $C_6H_5$ | 423 | ca − 1.4 | 10−* |
| PS-25 | —$CH_3$ | 415 | −1.5 | 9 |
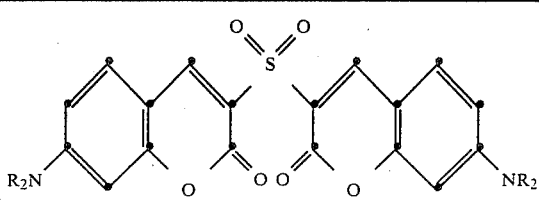
|   |   | λ-max | $E_{red}$ | Steps |
|---|---|---|---|---|
| PS-26 | R = $CH_2CH_3$ | 447 | ca − 1.4 | 12+* |
| PS-27 | R = $CH_2CH_2CH_3$ | 449 | ca − 1.4 | 13−* |
| PS-28 | 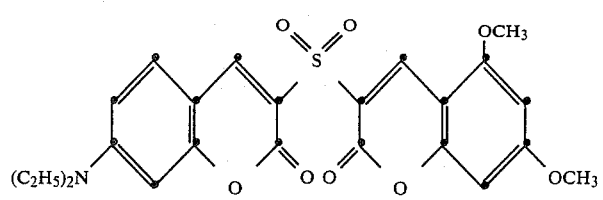 | 435 | | 11 |
|---|---|---|---|---|
| PS-29 | 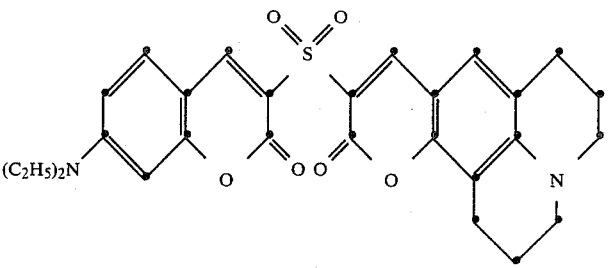 | 460 | | 13 |
|---|---|---|---|---|
| PS-30 | 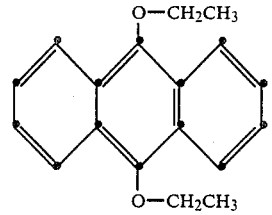 | 410 | | 4 |
|---|---|---|---|---|
9,10-diethoxyanthracene
| PS-31 | 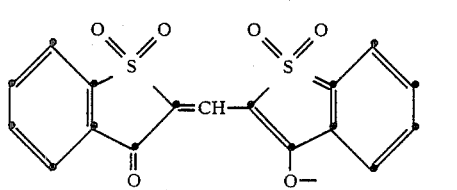 | 453 | −1.5 | 10* |
|---|---|---|---|---|

TABLE I-continued

[Structure: triphenylmethane dye with pyrylium-type core bearing R¹–R⁶ substituents and X⁻ counterion]

| | R¹ | R² | R³ | R⁴ | R⁵ | R⁶ | X⁻ | λ-max | E_red | Steps |
|---|---|---|---|---|---|---|---|---|---|---|
| PS-32 | H | —CH₂CH₃ | H | —CH₃ | COOCH₂CH₃ | H | Cl⁻ | 535 | −0.82 | 5⁺ |
| PS-33 | H | —CH₂CH₃ | H | —CH₃ | COOCH₂CH₃ | H | BF₄⁻ | 535 | −0.82 | 7⁻* |

PS-34 acridine orange

[Structure: (CH₃)₂N—C₆H₄—C=C₆H₄—N(CH₃)₂ with central N–H]    Cl⁻    502       10

PS-35

[Structure: (CH₃)₂N—C₆H₄—C=C₆H₄—N(CH₃)₂ with central N–C₁₂H₂₅]    Br⁻    503    −1.1    10⁺*

PTS = p-toluene sulfonate

EXAMPLES 36 THROUGH 91

A series of negative working photoresists were prepared and tested as described in connection with Examples 1 through 35, except that the dyes employed as photosensitizers in each instance exhibited a principal absorption peak at a wavelength longer than 550 nm. The results are reported below in Table II.

TABLE II

[Structure: cyanine dye with two indolenine units bearing R substituents, joined by (CH=CH)ₙCH= polymethine bridge; N-CH₃ groups; X⁻ counterion]

| | n | R | X⁻ | g-max | E_red | Steps |
|---|---|---|---|---|---|---|
| PS-36 | 1 | — | I⁻ | 555 | −1.00 | 6 |
| PS-37 | 2 | — | I⁻ | 650 | −0.82 | 4 |
| PS-38 | 3 | — | I⁻ | 750 | −0.67 | 1 |
| PS-39 | 3 | –(CH=CH)₂– | ClO₄⁻ | 791 | −0.68 | 1 |

| | | | | λ-max | E_red | Steps |
|---|---|---|---|---|---|---|

TABLE II-continued

PS-40** 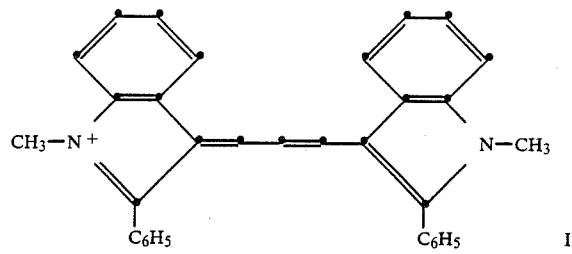 600  −0.49  0

PS-41 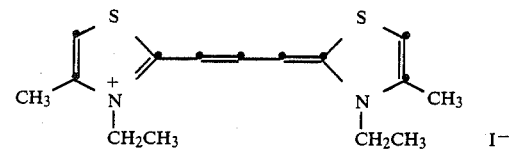 567  —  9−

PS-42 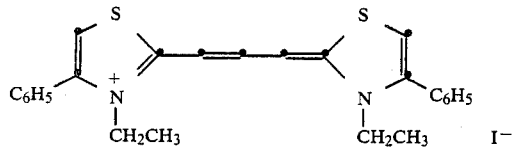 572  −1.35  11

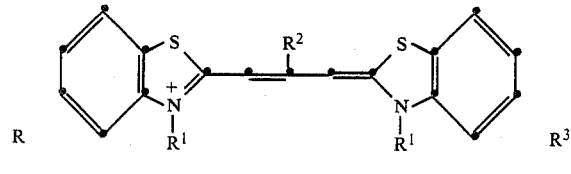

|  | R¹ | R² | R³ | X⁻ | λ-max | $E_{red}$ | Steps |
|---|---|---|---|---|---|---|---|
| PS-43 | —C₄H₉ | —H | — | I⁻ | 573 | −1.06 | 8+* |
| PS-44 | —C₁₈H₃₇ | —H | — | PTS⁻ | 574 | −1.06 | 7− |
| PS-45 | —C₄H₉ | —CH₃ | — | I⁻ | 560 | −1.10 | 10−* |
| PS-46 | —C₅H₁₁ | —CH₃ | — | I⁻ | 560 | −1.10 | 8+* |
| PS-47 | -i-C₃H₇ | —CH₃ | — | I⁻ | 566 | −1.10 | 9−* |
| PS-48 | —C₃H₇ | —C₂H₅ | — | I⁻ | 562 | −1.11 | 9+* |
| PS-49 | —C₂H₅ | —C₂H₅ | — | C₃F₇COO⁻ | 563 | −1.11 | 10* |
| PS-50 | —C₂H₅ | —C₆H₁₁ (cyclohexyl) | ₊CH=CH₎₂ | I⁻ | 590 | ca −1.10 | 8* |
| PS-51 | C₂H₅ | —C₁₅H₃₁ | ₊CH=CH₎₂ | I⁻ | 592 | ca −1.10 | 9+* |

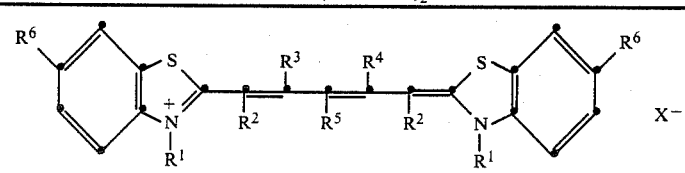

|  | R¹ | R² | R³ | R⁴ | R⁵ | R⁶ | X⁻ | λ-max | $E_{red}$ | Steps |
|---|---|---|---|---|---|---|---|---|---|---|
| PS-52 | —CH₂CH₃ | H | H | H | H | H | I⁻ | 670 | −0.89 | 6* |
| PS-53 | —CH₂CH₃ | H | H | H | H | —OCH₃ | PTS⁻ | 684 | | 8 |
| PS-54 | —CH₂CH₃ | H | H | H | —CH₃ | H | ClO₄⁻ | 666 | −0.93 | 7 |
| PS-55 | —CH₂CH₃ | H | —CH₂—C(CH₃)₂—CH₂— | | H | H | ClO₄⁻ | 663 | −0.98 | 9 |
| PS-56 | —CH₂CH₂CH₂— | H | H | H | H | H | PTS⁻ | 685 | −0.99 | 8 |
| PS-57 | —CH₂—CH₂— | | —CH₂—C(CH₃)₂—CH₂— | | H | H | PTS⁻ | 685 | −1.09 | 10 |

λ-max  $E_{red}$  Steps

TABLE II-continued

| | | λ-max | $E_{red}$ | Steps |
|---|---|---|---|---|
| PS-58 | [structure: bis-naphthothiazole pentamethine cyanine, N-C₂H₅, I⁻] | 705 | | 6 |
| PS-59 | [structure: bis-benzothiazole heptamethine cyanine, N-C₂H₅, I⁻] | 782 | −0.74 | 3 |
| PS-60 | [structure: bis-naphthothiazole with cyclopentene bridge bearing N(C₆H₅)₂, N-(CH₂)₃COOCH₃, ClO₄⁻] | 834 | | 1+ |
| PS-61 | [structure: bis-benzoxazole trimethine cyanine, N-CH₂CH₃, I⁻] | 595 | −1.05 | 9⁻* |
| PS-62 | [structure: bis-benzoxazole pentamethine cyanine, N-CH₂CH₃, I⁻] | 702 | −0.87 | 4+* |

[structure: bis-quinoline trimethine cyanine with N-R groups and X⁻]

| | R | X⁻ | λ-max | $E_{red}$ | Steps |
|---|---|---|---|---|---|
| PS-63 | —CH₂CH₂C₆H₅ | Br⁻ | 622 | −1.04 | 6 |
| PS-64 | —CH₂CH₃ | Cl⁻ | 621 | −1.04 | ca. 6 |

| | | λ-max | $E_{red}$ | Steps |
|---|---|---|---|---|
| PS-65 | [structure: bis-quinoline pentamethine cyanine with central CH₃, N-CH₂CH₃, PF₆⁻] | 725 | | 4⁻ |

TABLE II-continued
PS-66 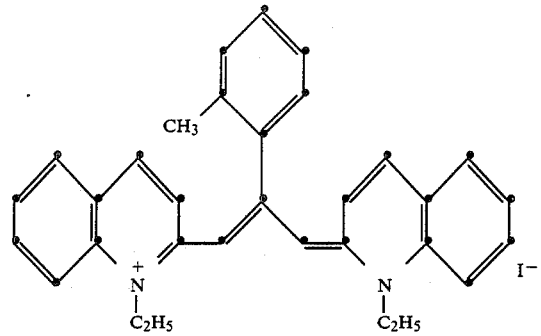 655 4
PS-67 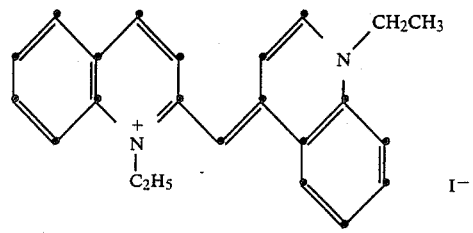 566 4
PS-68 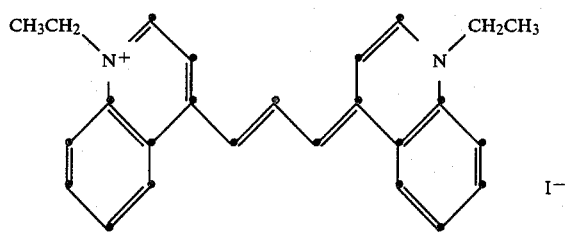 722 −0.86 6
PS-69 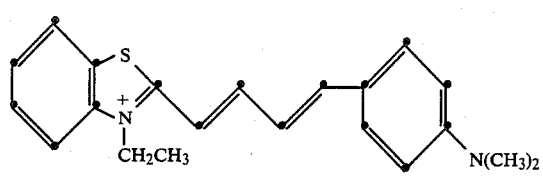 578 (broad) −0.75 Ca. 5
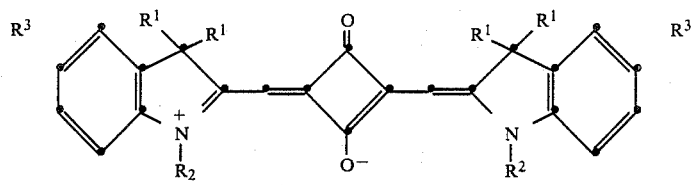
| | $R^1$ | $R^2$ | $R^3$ | λ-max | $E_{red}$ | Steps |
|---|---|---|---|---|---|---|
| PS-70 | —CH$_3$ | —CH$_3$ | — | 642 | −1.15 | 9–10 |
| PS-71 | —CH$_3$ | —CH$_3$ | ⁺CH=CH$_2$ | 673 | −1.08 | 9–10* |
| PS-72 | —CH$_3$ | —C$_6$H$_5$ | — | 652 | −0.98 | 9–10* |
| PS-73 | —CH$_3$ | 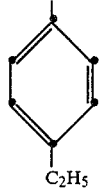 | — | 649 | −1.07 | 10* |
| PS-74 | 2 adjacent $R^1$ = ⁺CH$_2$)$_5$ i.e., spirocyclohexyl | | | 652 | −1.15 | 10* |

TABLE II-continued

| | λ-max | $E_{red}$ | Steps |
|---|---|---|---|
| PS-75 | 610 | −1.05 | 9–10* |

| | λ-max | $E_{red}$ | Steps |
|---|---|---|---|
| PS-76   R = $C_6H_5$ | 605 | −0.93 | 7+ |
| PS-77   R = —$C_{10}H_7$, i.e. α-naphthyl | 604 | −0.88 | 7 |
| PS-78 | 648 | −0.99 | 6 |
| PS-79 | 675 | −0.92 | 9 |
| PS-80 | 573 | −1.01 | 9 |

| $R^1$ | $R^2$ | $R^3$ | $R^4$ | $R^5$ | $R^6$ | $X^-$ | λ-max | $E_{red}$ | Steps |
|---|---|---|---|---|---|---|---|---|---|

TABLE II-continued

| | | | | | | | | λ-max | $E_{red}$ | Steps |
|---|---|---|---|---|---|---|---|---|---|---|
| PS-81 | H | —CH$_2$CH$_3$ | —CH$_2$CH$_3$ | H | COOCH$_2$CH$_3$ | H | ClO$_4^-$ | 566 | −0.79 | 2+ |
| PS-82 | | CH$_2$CH$_2$CH$_2$ | | CH$_2$CH$_2$CH$_2$ | COO$^-$ | H | — | 587 | −1.11 | 8+* |
| PS-83 | | CH$_2$CH$_2$CH$_2$ | | CH$_2$CH$_2$CH$_2$ | SO$_3^-$ | SO$_3$H | — | 592 | −1.01 | 8+* |

| | | λ-max | $E_{red}$ | Steps |
|---|---|---|---|---|
| PS-84 | pyronin y | 556 | ca −0.8 | 4 |
| PS-85** | oxazine 4 perchlorate | 622 | −0.29 | 0 |
| PS-86** | oxazine 170 perchlorate | 630 | −0.32 | 0 |
| PS-87** | oxazine 1 perchlorate | 658 | −0.33 | 0 |
| PS-88 | | 620 | | 8 |
| PS-89 | | 612 | −1.10 | 12 |

TABLE II-continued

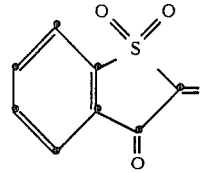

|       | n | λ-max | $E_{red}$ | Steps |
|-------|---|-------|-----------|-------|
| PS-90 | 1 | 553   | −1.2      | 11+*  |
| PS-91 | 2 | 656   | −1.0      | 10+*  |

**Comparative examples showing inoperability resulting from inappropriate reduction potentials.

EXAMPLES 92 THROUGH 132

Most of the experiments reported in Examples 1 through 91 were repeated, but with the coated samples held for more than 6 months. In comparing performances of fresh coated samples with those stored at room temperature for more than 6 months no variances in the number of steps developed was observed or at most variances of only one step. These observations were made using the dyes represented by the asterisks in Tables I and II.

These examples illustrate the outstanding stability of the imaging compositions and, particularly, the photosensitizer coinitiators of this invention.

EXAMPLES 133 THROUGH 162

The procedure of Examples 1 through 91 was repeated, but with a variety of differing azinium activators substituted for Activator A. The photoresist contained photosensitizer PS-26 (I), PS-72 (II), or PS-49 (III). The results are listed below in Table III. All of the azinium activators were effective. When no azinium activator was present in the photoresist, all of the photoresist was removed on development with PS-72 or PS-49 present and, with PS-26 present, all but two steps of the photoresist was removed.

PR-1 in a concentration of 2 percent by weight, based on total weight. The photosensitizer, the leuco dye and its concentration, the image color, the number of steps developed, and the color of imaging composition coating following development, are reported in Table IV below.

TABLE IV

| Photosensitizer | Leuco Dye. | Steps | Final Color   |
|-----------------|------------|-------|---------------|
| PS-26           | None       | 12+   | —             |
| PS-26           | A          | 10+   | Yellow-Orange |
| PS-26           | B          | 12+   | Yellow        |
| PS-49           | None       | 10+   | —             |
| PS-49           | C          | 9+    | Violet        |
| PS-49           | D          | 9+    | Red-Violet    |
| PS-72           | None       | 9     | —             |
| PS-72           | E          | 9+    | Dark Blue     |

From Table IV it is apparent that the presence of the leuco dye in the imaging composition had little effect on the number of steps developed, thereby demonstrating the compatibility of the leuco dye with the photoinitiators.

A = A phthalide yellow dye available under the trademark Copikem XI from Hilton-Davis, a subsidiary of Sterling Drug, Inc., P.O. Box 37869, Cincinnati, Ohio 45222;

B = An aminophenylpyridine dye available under the trademark Reackt-yellow 186 from BASF Aktiengesellshaft, D-6700 Lindwigshafen, W. Germany;

TABLE III

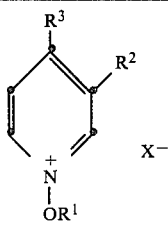

| $R^1$ | $R^2$ | $R^3$ | $X^-$ | Steps I | II | III |
|-------|-------|-------|-------|----|----|----|
| $CH_3$ | H | $C_6H_5$ | $BF_4^-$ | 12+ | 9+ | 10− |
| $CH_3$ | H | $C_6H_5$ | $C_3F_7COO-$ | 9 | 6 | 6+ |
| $CH_3$ | H | CN | $BF_4^-$ | 9+ | — | — |
| $CH_3$ | H | $COOCH_3$ | $PF_6^-$ | 11− | 5− | 9 |
| $CH_3$ | H | $COOCH_2CH_2C_6H_5$ | $BF_4^-$ | 10+ | 5+ | 9− |
| $CH_3$ | $COOCH_3$ | H | $PF_6^-$ | 13− | 8 | 9 |
| $CH_3$ | $COOCH_2CH_2C_6H_5$ | H | $PF_6^-$ | 12+ | 8− | 10− |
| $CH_3$ | $COOCH_2CH_2C_6H_5$ | H | $BF_4^-$ | 11+ | 10 | 11 |
| $CH_3$ | $COOCH_2CH_2OC_2H_5$ | H | $BF_4^-$ | 12+ | 9 | — |
| $C_2H_5$ | H | $C_6H_5$ | $BF_4^-$ | 10+ | 7+ | 9 |
| $C_4H_9$ | H | $C_6H_5$ | $PF_6^-$ | — | 7+ | 7 |

EXAMPLES 163 THROUGH 168

The procedure of Examples 1 through 91 was repeated, but with dye precursors, in this instance leuco dyes, additionally present in the imaging composition C = A phthalide red dye available under the trademark Copikem XX from Hilton-Davis;

D = A diazorhodamine lactone dye available under the trademark Reackt-red 448 from BASF;

E = A triphenylmethane dye available under the trademark Kodak-3651 from the Eastman Kodak Company, 343 State St., Rochester, N.Y. 14650;

APPENDIX

The dyes employed as photosensitizers can be selected from among conventional dyes, the preparation of which is generally known. However, since dyes PS-24, PS-26, and PS-27 are novel, an exemplary preparation for each of these dyes is included.

A. Preparation of 7-Diethylamino-3-phenylsulfonylcoumarin (PS-24)

A mixture of 1 g (0.0052 mole) 4-diethylaminosalicylaldehyde and 1 g (0.0044 mole) ethyl 2-phenylsulfonyl acetate in 5 mL ethyl alcohol was heated until the aldehyde dissolved. Piperidine (10 drops) was added and the reaction mixture was heated at reflux on a steam bath for 1¾ hours. After chilling in the freezer, the product was collected and recrystallized twice from ethyl alcohol/acetonitrile.

NMR(CDCl$_3$) ($\delta$) 1.22 (t, —CH$_3$), 3.45 (q, —CH$_2$—), 6.40 (d, H-8, J=2.4 Hz), 6.63 (dd, H-5, J$_{5-6}$=9 Hz J$_{6-8}$=2.4 Hz) 7.32–7.67 (m, H-5, 3', 4') 8.02–8.22 (m, H-2'), 8.53 (s, H-4)

B. Preparation of 3,3'-sulfonylbis(7-diethylaminocoumarin) (PS-26)

A solution of 12 g (0.062 mole) 4-diethylaminosalicylaldehyde, 5 g (0.024 mole) dimethyl 2,2'-sulfonyldiacetate, 100 mL ethyl alcohol and 3.3 mL piperidine was heated at reflux on a steam bath for 1 hour. The reaction mixture was chilled, the product collected and recrystallized twice from a mixture of 300 mL ethyl alcohol/100 mL acetonitrile. Yield 7.0 g.

NMR(CDCl$_3$) ($\delta$) 1.22 (t, —CH$_3$), 3.45 (q, N—CH$_2$), 6.45 (br, s, H-8,8') 6.65 (br. d, H-6,6'), 7.45 (d, H-5,5'), 8.65 (br. s, H-4,4')

C. Preparation of 3,3'-Sulfonylbis(7-dipropylaminocoumarin) (PS-27)

A solution of 2 g (0.0103 mole) of 4-di-n-propylamino salicylaldehyde, 1 g (0.0042 mole) of dimethyl 2,2'-sulfonyldiacetate, 50 mL of ethyl alcohol and 0.5 mL piperidine was stirred overnight at room temperature then heated at reflux on a steam bath for 6 hours. The reaction mixture was chilled in a freezer and the solid collected. The product was recrystallized three times from a mixture of ethyl alcohol/acetonitrile. Yield 0.35 g.

NMR (CDCl$_3$) ($\delta$) 0.95 (t, —CH$_3$), 1.62 (m, —CH$_2$—), 3.33 (t, N—CH$_2$), 6.40 (br.s, H-8,8'), 6.60 (br.d, H-6,6'), 7.43 (d, H-5,5'), 8.63 (s, H-4,4').

The invention has been described in detail with particular reference to preferred embodiments thereof, but it will be understood that variations and modifications can be effected within the spirit and scope of the invention.

What is claimed is:

1. A photographic imaging system consisting essentially of
    an imaging dye or precursor thereof,
    a hardenable organic component chosen from the class consisting of monomers, oligomers, and polymers each containing ethylenic unsaturation and capable of selective immobilization by addition at the sites of ethylenic unsaturation and
    coinitiators for ethylenic addition comprised of
    an effective amount of a quaternized azinium salt activator and
    a concentration sufficient to increase response of the photoresist to light of a photosensitizer which is a dye exhibiting a reduction potential which in relation to that of said azinium salt activator is at most 0.1 volt more positive, with the further proviso that, when said photosensitizer is a keto dye having its principal absorption peak at a wavelength shorter than 550 nm, it exhibits when excited by imaging radiation an intersystem crossing efficiency to a triplet state of less than 10 percent, said photosensitizer being chosen to exhibit a maximum absorption peak in a different portion of the spectrum than said imaging dye or its precursor.

2. A photographic imaging system according to claim 1 in which said hardenable organic component is comprised of at least one addition polymerizable ethylenically unsaturated compound having a boiling point above 100° C. at normal pressure.

3. A photographic imaging system according to claim 2 in which said polymerizable ethylenically unsaturated compound is a monomer.

4. A photographic imaging system according to claim 2 in which said polymerizable ethylenically unsaturated compound is an oligomer.

5. A photographic imaging system according to claim 2 in which said polymerizable ethylenically unsaturated compound is a crosslinkable polymer.

6. A photographic imaging system consisting essentially of
    an imaging dye or precursor thereof,
    a hardenable organic component chosen from the class consisting of monomers, oligomers, and polymers each containing ethylenic unsaturation and capable of selective immobilization by addition at the sites of ethylenic unsaturation and
    coinitiators for ethylenic addition comprised of
    an effective amount of a quaternized azinium salt activator and
    a concentration sufficient to increase response of the photoresist to light of a photosensitizer which is a dye having its principal absorption peak at a wavelength longer than 550 nm and exhibiting a reduction potential which in relation to that of said azinium salt activator is at most 0.1 volt more positive, said photosensitizer being chosen to exhibit a maximum absorption peak in a different portion of the spectrum than said imaging dye or its precursor.

7. A photographic imaging system according to claim 1 in which said photosensitizer exhibits a reduction potential that is more negative than the reduction potential of said azinium activator.

8. A photographic imaging system according to claim 1 in which said photosensitizer is a rhodamine, anthracene, azo, aniline, or acridine dye.

9. A photographic imaging system according to claim 1 in which said photosensitizer is a polymethine dye.

10. A photographic imaging system according to claim 9 in which said photosensitizer is a cyanine, merocyanine, oxonol, hemioxonol, styryl, merostyryl, or streptocyanine dye.

11. A photographic imaging system according to claim 1 in which said photosensitizer is a dye which exhibits an intersystem crossing efficiency to a triplet state of less than 10 percent.

12. A photographic imaging system according to claim 1 in which said photosensitizer is a subtractive primary dye.

13. A photographic imaging system according to claim 2 in which said imaging dye is an additive or subtractive primary dye.

14. A photographic imaging system consisting essentially of
- a precursor of an imaging dye,
- a hardenable organic component chosen from the class consisting of monomers, oligomers, and polymers each containing ethylenic unsaturation and capable of selective immobilization by addition at the sites of ethylenic unsaturation and
- coinitiators for ethylenic addition comprised of
- an effective amount of a quaternized azinium salt activator free of a dye chromophore and stable in unfiltered room light and
- a concentration sufficient to increase response of the imaging composition to light of a photosensitizer which is a dye, said photosensitizer having its principal absorption peak at a wavelength longer than 550 nm and exhibiting a reduction potential which in relation to that of said azinium salt activator is at most 0.1 volt more positive, said photosensitizer being chosen to exhibit a maximum absorption peak in a different portion of the spectrum than said imaging dye or its precursor.

15. A photographic imaging system according to claim 1 wherein said photosensitizer is present in a concentration ranging from $5 \times 10^{-7}$ to $1 \times 10^{-4}$ mole per gram of dry solids.

16. A photographic imaging system according to claim 14 where said activator is present in a concentration of from $2 \times 10^{-5}$ to $25 \times 10^{-5}$ mole per gram of dry solids.

17. A photographic imaging system according to claim 1 wherein said azinium salt activator is free of a dye chromophore and is stable in unfiltered room light.

18. A photographic imaging system according to claim 1 wherein said photosensitizer is a dye having its principal absorption peak in the visible portion of the spectrum.

19. A photographic imaging system according to claim 18 wherein said photosensitizer is a magenta dye.

20. A photographic imaging system according to claim 18 wherein said photosensitizer is a cyan dye.

21. A photographic imaging system according to claim 14 wherein said imaging dye precursor is a leuco dye.

22. A photographic imaging system according to claim 14 wherein said imaging dye precursor is a triarylmethane, bisphenylmethane, xanthene, thiazine, spiropyran, or phthalocyanine chromogenic material.

23. A photographic imaging system according to claim 1 wherein said imaging dye is an azo or anthracene dye.

24. A photographic imaging system according to claim 1 wherein said imaging dye exhibits a shorter wavelength absorption peak than said photosensitizer.

* * * * *